US008474318B2

(12) United States Patent
Kazama et al.

(10) Patent No.: US 8,474,318 B2
(45) Date of Patent: Jul. 2, 2013

(54) ACCELERATION SENSOR

(75) Inventors: Atsushi Kazama, Kumagaya (JP); Masakatsu Saitoh, Mohka (JP); Ryoji Okada, Kumagaya (JP); Takanori Aono, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 574 days.

(21) Appl. No.: 12/670,964

(22) PCT Filed: Jun. 25, 2008

(86) PCT No.: PCT/JP2008/061536
§ 371 (c)(1),
(2), (4) Date: May 5, 2010

(87) PCT Pub. No.: WO2009/016900
PCT Pub. Date: Feb. 5, 2009

(65) Prior Publication Data
US 2010/0218607 A1 Sep. 2, 2010

(30) Foreign Application Priority Data

Jul. 27, 2007 (JP) ................. 2007-195744
Dec. 11, 2007 (JP) ................. 2007-319037
Dec. 11, 2007 (JP) ................. 2007-319038

(51) Int. Cl.
*G01P 15/12* (2006.01)
(52) U.S. Cl.
USPC ...................................... 73/514.33
(58) Field of Classification Search
USPC ...................................... 73/514.33
See application file for complete search history.

(56) References Cited

U.S. PATENT DOCUMENTS

| 6,984,925 | B2 | 1/2006 | Morley et al. | |
|---|---|---|---|---|
| 2005/0016271 | A1* | 1/2005 | Hashimoto et al. | 73/514.14 |
| 2006/0065054 | A1 | 3/2006 | Ikeda et al. | |
| 2007/0022811 | A1* | 2/2007 | Becka | 73/514.01 |
| 2007/0089514 | A1 | 4/2007 | Takeyari et al. | |

FOREIGN PATENT DOCUMENTS

| JP | 3-2535 A | 1/1991 |
|---|---|---|
| JP | 9-237902 A | 9/1997 |
| JP | 10-170380 A | 6/1998 |
| JP | 10-300773 A | 11/1998 |
| JP | 11-214705 A | 8/1999 |
| JP | 11-337571 A | 12/1999 |
| JP | 2000-46862 A | 2/2000 |
| JP | 2002-296293 A | 10/2002 |
| JP | 2003-101032 A | 4/2003 |
| JP | 2006-98321 A | 4/2003 |
| JP | 2003-172745 A | 6/2003 |
| JP | 2003-279592 A | 10/2003 |
| JP | 2004-184373 A | 7/2004 |
| JP | 2005-528829 A | 9/2005 |

(Continued)

*Primary Examiner* — Hezron E Williams
*Assistant Examiner* — Gregory J Redmann
(74) *Attorney, Agent, or Firm* — Sughrue Mion, PLLC

(57) ABSTRACT

An acceleration sensor having a support frame, a weight supported within the support frame via flexible beams, semiconductor piezoresistance elements provided on the beams, and wiring interconnecting the piezoresistance elements. The acceleration sensor detects acceleration from changes in resistance of the piezoresistance elements. Stress damping sections are provided on those portions of the beams which exclude the portions where the piezoresistance elements are provided. Each stress damping section is symmetrical with respect to the point of intersection between the length center line of the beam and the width center line of the beam.

11 Claims, 12 Drawing Sheets

FOREIGN PATENT DOCUMENTS

| | | |
|---|---|---|
| JP | 2006-98323 A | 4/2006 |
| JP | 2009-53179 A | 3/2009 |
| JP | 2009-53180 A | 3/2009 |
| WO | 2005/062060 A1 | 7/2005 |

* cited by examiner

200

ACCELERATION SENSOR

TECHNICAL FIELD

This invention relates to a semiconductor acceleration sensor for detection of acceleration, which is used in automobiles, aircraft, portable terminal equipment, and toys.

BACKGROUND ART

An acceleration sensor was often used to actuate an air bag, and grasped an impact in a collision of an automobile as acceleration. For the automobile, a one-axis (uniaxial) or two-axis (biaxial) function for measuring acceleration in the X-axis direction and/or the Y-axis direction was enough. The acceleration to be measured is so great that an acceleration sensor element for detecting acceleration is also produced sturdily. Recently, the acceleration sensor has found frequent use in portable terminal equipment and robots, and a three-axis (triaxial) acceleration sensor for measuring accelerations in the X-, Y- and Z-axis directions has been in demand in order to detect spatial movements. Also, a high-resolution downsized sensor has been in demand for detection of microacceleration.

The acceleration sensor is a method for converting the movement of a flexible beam into an electrical signal, and is roughly classified as the piezoresistance type, the electrostatic capacity type, and the piezoelectric type. Any of these types is selected in consideration of the magnitude of the output of the sensor, the frequency response characteristics, the electromagnetic resistance noise, the linearity of the output, detection of stationary acceleration, and the temperature characteristics. Microfabrication is needed to meet a demand for compactness and high sensitivity. Thus, a photolithography technology is used on a silicon substrate for fabrication, and impurities are implanted into the silicon by a semiconductor technology to form piezoresistance. A semiconductor piezoresistance element type triaxial acceleration sensor produced in this manner has been put to practical use.

In connection with semiconductor piezoresistance element type triaxial acceleration sensors, the applicant filed wide varieties of many patent applicants. Patent Documents 1 to 6 expressly indicate the shapes of weights, the shapes of beams, the arrangement of semiconductor piezoresistance elements, the connection of semiconductor piezoresistance elements, the shapes of junctions between the beams and support frames, and so on. The triaxial acceleration sensor is shown as an exploded perspective view in FIG. 15, a sectional view taken along line XVI A-XVI A in FIG. 15 is shown in FIG. 16A, and an acceleration sensor element used in the triaxial acceleration sensor is shown as a plan view in FIG. 16B. In a triaxial acceleration sensor 200, an acceleration sensor element 100 and a regulating plate 180 are adhered with predetermined spacing within a case 190 with the use of an adhesive 54 such as a resin. Chip terminals 104 of the acceleration sensor element 100 are connected to case terminals 192 by wires 58, and signals from the sensor are taken out from contact or external terminals 194. A case cover 195 is adhered onto the case 190 with the use of an adhesive 55, such as an AuSn solder, for sealing. The triaxial acceleration sensor element 100 is composed of a square support frame 10, a weight 20, and two pairs of beams 30, and the weight 20 is supported in the center of the support frame 10 by the two pairs of beams 30. Semiconductor piezoresistance elements $31x$, $31y$, $31z$ are formed in the beams 30. The X-axis semiconductor piezoresistance elements $31x$ and the Z-axis semiconductor piezoresistance elements $31z$ are provided in the pair of beams, and the Y-axis semiconductor piezoresistance elements $31y$ are provided in the other pair of beams. Since the semiconductor piezoresistance elements are arranged at the four ends of the pair of beams and they constitute a bridge circuit, a uniform resistance change in the semiconductor piezoresistance elements due to a temperature change can be cancelled. By changing the mariner of connection of the bridge circuit, moreover, the accelerations in the X-axis, the Y-axis and the z-axis can be separated and detected. In FIG. 16A, a spacing g4 between the lower surface of the weight 20 and the inner bottom surface of the case 190, and a spacing g3 between the upper surface of the weight 20 and the regulating plate 180 regulate the movement of the weight 20 to prevent damage to the beams 30, when excessive acceleration such as impact is imposed on the sensor. The basic structure of the semiconductor piezoresistance element type triaxial acceleration sensor according to the present invention is the same as those present in these patent documents, so that its detailed description is omitted, except where specifically noted. Hereinafter, the semiconductor piezoresistance element type triaxial acceleration sensor and element may be referred to simply as the acceleration sensor or the acceleration sensor element. Moreover, the acceleration sensor and the acceleration sensor element may be used synonymously.

In manufacturing the above acceleration sensor element, it is necessary to process the thickness of the beam highly accurately. Thus, it is common practice to use an SOI (silicon, on insulator) wafer having a thin silicon layer overlaid on the surface of a thick silicon layer via a silicon oxide film layer. Shapes such as beams are processed in the thin silicon layer with the use of the silicon oxide film layer as an etching stopper, and then grooves are processed in the thick silicon layer to separate the support frame and the weight, whereby a structure having the weight supported by the support frame aria the beams comprising the thin silicon layer can be produced.

With the semiconductor piezoresistance element type triaxial acceleration sensor, the weight is provided with notched portions, and the beams are connected to the notched portions, whereby downsizing and high sensitivity can be achieved at the same time. In regard to the acceleration sensor of such a structure, Patent Document 7 to Patent Document 10, for example, offer descriptions. A representative structure thereof is shown as a perspective view in FIG. 17. In an acceleration sensor element 100', notches 22 are provided in portions of a weight 20' to which beams 30 are connected, and the beams 30 are connected to the weight 20' at the farthest ends of the notches 22. Even if the weight 20' is formed amply inside the support frame 10, therefore, the beams 30 can be lengthened by the lengths of the notches 22, with the result that a sensor with high sensitivity can be obtained, even when its area is small.

Patent Document 1: JP-A-2003-172745
Patent Document 2: JP-A-2003-279592
Patent Document 3: JP-A-2004-184373
Patent Document 4: JP-A-2006-098323
Patent Document 5: JP-A-2006-098321
Patent Document 6: WO2005/062060A1
Patent Document 7: JP-A-11-214705
Patent Document 8: JP-A-2002-296293
Patent Document 9: JP-A-2003-101032
Patent Document 10: JP-A-9-237902
Patent Document 11: JP-A-3-2535
Patent Document 12: JP-A-10-170380
Patent Document 13: JP-A-2000-46862

DISCLOSURE OF THE INVENTION

Problems to be Solved by the Invention

With the acceleration sensor 200 shown in FIG. 15, external force is applied to the sensor chip owing to the cure shrinkage of the adhesive for adhering the sensor chip constituting the acceleration sensor element 100 to the case, heat deformation due to the difference in the coefficient of thermal expansion between the case and the sensor chip, and the bending of a mounted circuit board after mounting of the sensor on the printed circuit board. Upon application of the external force, stress in a direction in which the beams of the sensor chip extend occurs in the beams. When a force for bending convexly in an upward direction acts on the sensor chip, for example, tensile stress acts on the beam. When the sensor chip is bent convexly in a downward direction, compressive stress works on the beam. When the stress in the direction of the beam extending is applied to the beam, deformability of the beam changes. Thus, the stress change of the piezoresistance element per unit acceleration changes, causing a possibility for change in the sensor sensitivity.

Patent Document 11 discloses a structure in which an acceleration sensor chip is packaged using a wafer level packaging technology. Patent Document 12 discloses a technology for resin molding a semiconductor sensor. A study is under way on an acceleration sensor 300', as shown in a sectional view of FIG. 18, which has been subjected to wafer level packaging and resin molding by use of these technologies. An upper cap chip 150 and a lower cap chip 160 are joined to the acceleration sensor element 100' from above and below it to constitute an MEMS acceleration sensor assembly 170' having movable portions of the acceleration sensor element 100' hermetically sealed. Electrode pads 174 of the acceleration sensor element 100' are exposed to the upper cap chip 150, whereby wire bonding can be performed. The electrode pad 174 and an external terminal 56 are wire bonded by a wire 58 for electrical connection, and then encapsulated in a molding resin 60 to obtain a resin-packaged acceleration sensor.

With the acceleration sensor of Patent Document 11, the same material is used for the sensor chip and the cap chip to eliminate a difference in the coefficient of thermal expansion. However, warp deformation occurs because of an insulating film and a metal film formed on the surfaces of the sensor chip and the cap chip. At the time of joining the cap chip, therefore, external force is applied to the sensor chip, arousing a possibility for a change in stress in the direction in which the beams extend. When the resin package shown in FIG. 18 is assembled, moreover, the cure shrinkage of the molding resin and heat deformation due to the difference in the coefficient of thermal expansion exert influences. After mounting, the bend of the mounted circuit board may apply external force to the sensor chip, resulting in a change in sensitivity. Patent Document 13 discloses that two beams are provided such that a convex bending portion protruding in one direction is provided nearly in the center of each beam, and the protrusions of the bending portions are in different directions. Since the two beams are provided, the center lines of the support frame and the weight, and the center line of the beams are not located on the same lines, thus lacking in symmetry. As a result, relaxation of the external force has not been sufficient. There is also disclosed a shape in which the center line of the beam connected to the support frame and the center line of the beam connected to the weight are arranged to be displaced, and they are connected by a beam. However, this shape is of a structure which lacks symmetry with respect to the center lines of the support frame and the weight, so that external force has not been relaxed sufficiently. With the resin-molded acceleration sensor as shown in FIG. 18, in particular, external force applied is so great that it has been difficult to decrease a change in sensitivity.

It is an object of the present invention to solve the above-mentioned problems, achieve a structure which minimizes a change in sensor sensitivity even upon application of external force to the sensor chip, and realize an acceleration sensor with minimal fluctuations in characteristics.

Means for Solving the Problems

The acceleration sensor of the present invention comprises an acceleration sensor element including a support frame; a weight movable relative to the support frame when acceleration is applied from an outside; a plurality of flexible beams for connecting the weight and the support frame to support the weight; semiconductor piezoresistance elements (hereinafter referred to as "piezoresistance elements") provided on the beams near sites where the beams are connected to the weight or the support frame; and wirings connected to the piezoresistance elements and provided on the beams, the acceleration sensor element being adapted to detect the acceleration applied from the outside in response to changes in resistance of the piezoresistance elements. Of the plurality of beams, the beams provided with the piezoresistance elements for detecting acceleration in a thickness direction of the beams each have at least one stress damping section.

When external force is exerted on the acceleration sensor element, the sensitivity of acceleration detection changes in each of the X-, Y- and Z-axis directions, and the acceleration detection sensitivity in the Z-axis direction, in particular, is affected. Assuming that the upper surface of the acceleration sensor element is an X-Y plane, the Z-axis is in the thickness direction of the beam. Under disturbance force, warpage occurs in the Z-axis direction, so that a sensitivity change in the Z-axis direction, which is about an order of magnitude greater than those in the X- and Y-axis directions, takes place. For this reason, at least the beam provided with the piezoresistance element for detecting acceleration in the Z-axis is provided with the stress damping section. The stress damping section can also be provided for the beam other than that in the Z-axis. To distinguish between the external force, which is exerted on the acceleration sensor and should essentially be measured, and external force which brings about a change in sensitivity, the external force which gives acceleration to be measured is called external force, and unnecessary external force is called disturbance force.

The concept of the present invention that the stress damping section is provided on the beam can be applied to any of a uniaxial acceleration sensor which can measure acceleration in one of the X-, Y- and Z-axes, a biaxial acceleration sensor which can measure accelerations in two of the X-, Y- and Z-axes, and a triaxial acceleration sensor which can measure accelerations in all of the X-, Y- and Z-axes.

Even if disturbance force is applied to the acceleration sensor element, whereby tensile or compressive force is exerted on the beam in the direction in which the beam extends, the provision of the stress damping section on the beam enables this force to be absorbed by the stress damping section. Since the disturbance force is absorbed by the stress damping section, stress imposed in the direction in which the beam extends becomes minimally changeable, and the deformability of the beam also becomes difficult to change.

Thus, it becomes possible to reduce the change in sensitivity due to the disturbance force applied to the acceleration sensor element, particularly, the beam. With the conventional acceleration sensor without the stress damping section, sensitivity along the Z-axis changes by 20 to 50% under the disturbance force. When the stress damping section is provided, the change in the sensitivity along the Z-axis can be reduced by nearly an order of magnitude.

With the acceleration sensor of the present invention, it is preferred that the stress damping section be provided on a portion of the beam which is outside regions of the beam where the piezoresistance elements are provided, and the beam be symmetrical with respect to the point of intersection between the length center line of the beam and the width center line of the beam.

A case produced from a ceramic or a metal and divided into a box-shaped bottom box and a cover can be used as a protective case for holding the acceleration sensor element, and the acceleration sensor element can be encapsulated in the case to form the acceleration sensor. Alternatively, there can be used a resin package acceleration sensor having the acceleration sensor element encapsulated by a molding resin, the acceleration sensor element being subjected to wafer level package as a protective case.

Preferably, at least one stress damping section formed in the beam is disposed symmetrically with respect to the length center line of the beam and the width center line of the beam. Spacing between a plurality of the stress damping sections arranged can be determined in consideration of the length of the beam and the dimensions of the stress damping section.

The beam provided with the stress damping section has a first portion connecting the weight and the stress damping section, and a second portion connecting the support frame and the stress damping section. The first portion and the second portion extend in a direction in which the entire beam extends, and have substantially the same thickness. Preferably, the first portion and the second portion of the beam bend in the same direction under stress applied to the beam from the outside in the direction in which the entire beam extends.

When the acceleration sensor element undergoes disturbance force to have the beam deformed, the length of the first portion of the beam located between the weight and the stress damping section may coincide with the length of the second portion located between the support frame and the stress damping section. In this case, deformation of the first portion and that of the second portion of the beam, with the stress damping section being sandwiched therebetween, become symmetrical. The symmetry of the deformations of the first portion and the second portion of the beam facilitates coincidence between changes in stress imposed on the piezoresistance elements arranged near both ends of the beam. Since the piezoresistance elements arranged near both ends of the beam show nearly the same resistance changes, differences in resistance changes due to the disturbance force can be decreased. If the change in resistance is the same and the balance remains unchanged, the output of the bridge circuit does not change. Thus, a change in the output due to the disturbance force exerted on the acceleration sensor element can be reduced.

An insulating film of alumina or silicon oxide, metal wirings, etc. are formed on the surface of the beam, and the beam and these different materials have different Young's moduli and thermal expansion coefficients. Thus, the beam essentially has stress which causes warping in the thickness direction. When the beam is composed of a single continuous material, a certain portion of the beam warps in a direction opposite to the direction in which stress is applied. Such a shape is unstable, and aggravates a change in sensitivity when disturbance force is exerted in the direction in which the beam extends. Since the stress damping section deforms torsionally, there can be achieved such a shape that the first portion and the second portion of the beam located on both sides of the stress damping section warp in the direction in which stress is imposed, with the stress damping section as the point of discontinuity of the curvature of warping. As a result, deformation of the beam becomes stable, and a change in sensitivity due to disturbance force can be diminished. Depending on the magnitude of the torsional effect of the stress damping section, a portion warping in a direction opposite to the direction in which stress is imposed occurs in the vicinity of the junction of the beam with the stress relaxation layer. However, most of the beam warps naturally, so that the effect of dissolving unstable deformation can be fully expected.

With the acceleration sensor of the present invention, the stress damping section can be a frame which is connected to an end of the first portion opposite to an end of the first portion connected to the weight and is connected to an end of the second portion opposite to an end of the second portion connected to the support frame, and which has an opening in the center thereof.

By forming the framed stress damping section in the beam, disturbance force exerted in the direction in which the entire beam extends can be absorbed. Stress causing extension or contraction in the direction in which the beam extends is absorbed by the deformation of the framed stress damping section. The resulting torsion of the framed stress damping section facilitates such deformation that the first portion and the second portion of the beam located on both sides of the stress damping section bend in the thickness direction of the beam. Owing to the deformation of the framed stress damping section, stress in the direction in which the beam extends changes minimally responsive to the disturbance force exerted in the direction in which the beam extends, whereby changes in sensitivity can be reduced. The use of the framed stress damping section makes it possible to prevent such deformation that the beam bends in its width direction.

With the acceleration sensor of the present invention, the framed stress damping section can be of a quadrate shape, a polygonal shape having an even number of sides, a round shape, an elliptical shape, or a modification of any of these.

The frame is in a shape having an outer edge and an inner edge, like a picture frame, and the shapes of the outer edge and the inner edge are nearly similar. The term "nearly similar" means that the edge widths can be different depending on the location. For example, the outer edge can be of a square shape, and the inner edge can be of a rectangular shape. The quadrate shape includes a square shape, a rectangular shape, and a parallelogram. The polygonal shape is preferably that having an even number of sides, and it is not preferred to use a triangular or a pentagonal shape having an odd number of sides, because they do not give a uniform deformation or torsion. The corners of the polygonal shape can be provided with curvature. The round shape faces difficulty with deformation which causes extension or contraction in the direction in which the beam extends. Because of torsion, however, the round shape can be expected to show the effect of facilitating deformation in which the frame bends in the thickness direction of the beam. The elliptical shape can cause the deformation and torsion of the frame, and thus is higher in efficiency than the circular shape. A combination of the circular outer edge and the elliptical inner edge, or vice versa, can form the stress damping section having no linear portion. The term "deformation" means, for example, an hourglass shape in which the opposing sides of the quadrate shape have inward curvature, or the shape of a track in a sports ground where straight lines and curves are combined.

The framed stress damping section used in the present invention is preferably a quadrilateral frame comprising a first frame side which is connected to an end of the first portion of the beam where the stress damping section is provided, the end being opposite to an end of the first portion connected to the weight, and which extends in the width direction of the beam; a second frame side which is connected to an end of the second portion opposite to an end of the second portion connected to the support frame, and which extends in the width direction of the beam; and a third frame side and a fourth frame side which interconnect the ends of the first frame side and the second frame side and which extend in the direction in which the entire beam extends.

In the present invention, it is preferred that an inside distance between the third frame side and the fourth frame side, which the framed stress damping section has, be larger than the width of the beam where the stress damping section is provided.

It is important that the inside distance between the third frame side and the fourth frame side be larger than the width of the beam. If the outside width of the frame is the same as the width of the beam and the inside width of the frame is smaller than the width of the beam, that is, if a quadrate hole is formed in the beam, deformation can scarcely be expected, so that the effect of the stress damping section is absent. By disposing the inner edges of the frame sides of the stress damping section outwardly of the side edges of the width of the beam, deformation or torsion is likely to occur, thus enabling the stress relaxing effect to be exhibited.

Preferably, the first and second frame sides, and the third and fourth frame sides, which the framed stress damping section used in the present invention has, are different from each other in width, and the first frame side, the second frame side, the third frame side, the fourth frame side, and the beam where the stress damping section is provided are different from each other in width. Preferably, moreover, the frame sides, which the stress damping section has, are each thinner than the beam where the stress damping section is provided.

With the acceleration sensor of the present invention, if of the plurality of beams, the beams provided with the semiconductor piezoresistance elements for detecting the acceleration in the thickness direction of the beams each have a plurality of the stress damping sections, the beam provided with the plurality of stress damping sections has a first portion connecting the weight and one of the stress damping sections, a second portion connecting the support frame and another of the stress damping sections, and at least one third portion connecting adjacent two of the plurality of stress damping sections. The first, second and third portions extend in the direction in which the entire beam extends, and have substantially the same thickness. The plurality of stress damping sections can each be a frame which is provided between the first portion or the second portion and one of the third portions, or between two of the third portions, which is connected to an end of one of the third portions, and to an end of the first portion or the second portion opposite to an end of the first portion or the second portion connected to the weight or the support frame, or to an end of the other third portion, and which has an opening in the center thereof.

The plurality of stress damping sections can each be a quadrilateral frame comprising a first frame side which is connected to an end of the first portion of the beam where the plurality of stress damping sections are provided, the end being opposite to an end of the first portion connected to the weight, or is connected to an end of one of the third portions of the beam, and which extends in the width direction of the beam; a second frame side which is connected to an end of the one of the third portions, or to an end of the second portion opposite to an end of the second portion connected to the support frame, and which extends in the width direction of the beam; and a third frame side and a fourth frame side which interconnect the ends of the first frame side and the second frame side and which extend in the direction in which the entire beam extends.

With the acceleration sensor of the present invention, the stress damping section can be composed of sides which are located between the first portion and the second portion, which continue from an end of the first portion opposite to an end of the first portion connected to the weight and continue to an end of the second portion opposite to an end of the second portion connected to the support frame, and which are connected zigzag.

The sides connected zigzag can comprise a first side which is connected to an end of the first portion of the beam where the stress damping section is provided, the end being opposite to an end of the first portion connected to the weight, and which extends in the width direction of the beam; a second side which is connected to an end of the second portion opposite to an end of the second portion connected to the support frame, and which extends in the width direction of the beam and in a direction opposite to the first side; a third side extending from an outer end of the first side in the direction in which the entire beam extends; a fourth side extending from an outer end of the second side in the direction in which the entire beam extends; and a fifth side which is located on a line drawn in the width direction of the beam at a midpoint between a point where the first side is connected to the first portion and a point where the second side is connected to the second portion, and which interconnects the ends of the third side and the fourth side.

By providing the beam with the stress damping section having the zigzag connected sides, disturbance force exerted in the direction in which the entire beam extends can be absorbed. Stress causing extension or contraction in the direction in which the beam extends is absorbed by the deformation of the sides of the stress damping section. The resulting torsion of the stress damping section makes it easy for the first portion and the second portion of the beam located on both sides of the stress damping section to bend in the thickness direction of the beam. Owing to the deformation of the sides of the stress damping section, stress in the direction in which the beam extends changes minimally responsive to the disturbance force exerted in the direction in which the beam extends, whereby changes in sensitivity can be reduced. The stress damping section having the sides connected zigzag has a high effect of absorbing stress causing extension or contraction in the direction in which the beam extends, in comparison with the framed stress damping section. If the zigzag connected sides are sides extending in one direction only, bending in the width direction of the beam is apt to occur. When the sides connected zigzag have the sides protruding in the width direction and in mutually opposite directions, deformation biases in one direction can be prevented.

With the acceleration sensor of the present invention, of the plurality of beams, the beams provided with the piezoresistance elements for detecting the acceleration in the thickness direction of the beams can each have a plurality of the stress damping sections. The beam provided with the plurality of stress damping sections has a first portion connecting the weight and one of the stress damping sections, a second portion connecting the support frame and another of the stress damping sections, and at least one third portion connecting adjacent two of the plurality of stress damping sections. The first, second and third portions extend in a direction in which the entire beam extends, and have the same thickness. The plurality of stress damping sections are each composed of sides which are provided between the first portion or the second portion and one of the third portions of the beam, or between two of the third portions, which continue from an end of one of the third portions to an end of the first portion or the second portion opposite to an end of the first portion or the second portion connected to the weight or the support frame, or to an end of the other third portion, and which are connected zigzag.

The sides connected zigzag can comprise a first side which is connected to an end of the first portion of the beam where the plurality of stress damping sections are provided, the end being opposite to an end of the first portion connected to the weight, or is connected to an end of one of the third portions of the beam, and which extends in the width direction of the beam; a second side which is connected to an end of the one of the third portions, or to an end of the second portion opposite to an end of the second portion connected to the support frame, and which extends in the width direction of the beam and in a direction opposite to the first side; a third side extending from an outer end of the first side in the direction in which the entire beam extends; a fourth side extending from an outer end of the second side in the direction in which the entire beam extends; and a fifth side which is located on a line drawn in the width direction of the beam at a midpoint between a point where the first side is connected to the first portion or the third portion and a point where the second side is connected to the third portion or the second portion, and which interconnects the ends of the third side and the fourth side.

There is no need to enhance the effect of absorbing stress more than necessary by increasing the number of the sides connected zigzag. The increase in the number of the sides connected zigzag leads to an increase in the length of the beam, and an associated increase in the length of the metal wirings connecting the semiconductor piezoresistance elements. The increased length of the metal wiring raises electrical resistance, inducing an increase in power consumption. This is not desirable. Moreover, it is feared that undesirable side effects will occur, such that the beam becomes excessively flexible and resonance frequency declines. Thus, it is preferred to form the stress damping section from the minimum number of sides.

The stress damping section can be formed from curved portions like nearly S-shaped portions instead of a combination of linear portions. Furthermore, zigzag sides comprising a combination of linear and curved portions can be used.

With the acceleration sensor of the present invention, an inside distance between the third side and the fourth side among the sides connected zigzag is preferably larger than the width of the beam where the stress damping section is provided.

With the acceleration sensor of the present invention, the first side and the second side, and the third side and the fourth side, of the sides connected zigzag, can be different from each other in width, and the first side, the second side, the third side, the fourth side, and the beam where the stress damping section is provided can be different from each other in width.

In the case of the framed stress damping section, the widths of the frame sides can be different depending on the site, and can also differ from the width of the beam. However, they need to be symmetrical with respect to the width center line and the length center line of the beam. If the symmetry is destroyed, deformations of the right first portion and the left second portions of the beam sandwiching the stress damping section tend to be asymmetrical, when the stress damping section is deformed under disturbance force on the acceleration sensor element. The asymmetry of beam deformation brings forces on the piezoresistance elements located at both ends of the beam out of balance, upsetting the resistance balance of the bridge. Thus, it becomes difficult to reduce changes in output due to disturbance force. The same holds true of the stress damping section comprising the zigzag connected sides, and the stress damping section is preferably symmetrical with respect to its center.

With the acceleration sensor of the present invention, the sides connected zigzag are each preferably thinner than the beam where the stress damping section is provided.

By making the thickness of the stress damping section smaller than the thickness of the beam, the stress damping effect can be improved further. By decreasing the thickness of the beam at the middle part of the beam, the beam easily bends and the effect of absorbing disturbance force can be expected, even if the stress damping section as in the present invention is not provided. However, this effect is low, because the disturbance force exerted in the direction in which the beam extends cannot be absorbed by the extension and contraction of the beam. The decreased thickness of the beam at the middle part of the beam is inferior to the framed or zigzag-shaped stress damping section in the effect of suppressing changes in sensitivity in the Z-axis, and obtains only the effect of nearly halving changes in the sensitivity in the Z-axis of about 20 to 50% in the conventional acceleration sensor without the stress damping section. Thinning of the framed or zigzag-shaped stress damping section can be expected to bring greater stress damping. Decreasing the wall thickness of the stress damping section, however, increases man-hours in production, and this is not desirable from the viewpoint of production. When the framed or zigzag-shaped stress damping section is formed with the same thickness as the beam, this can be done merely by changing masks for photolithography. Thus, the production man-hours do not increase.

It is preferred that the wirings formed in the framed stress damping section be symmetrical with respect to the width center line of the beam provided with the stress damping section.

The metal wirings connecting the piezoresistance elements, especially, the metal wirings led out from the piezoresistance elements formed at the root of the beam facing the weight, are led out onto the support frame past the site over the beam. The influence of stress generated by the metal wirings is preferably symmetrical with respect to the length center line and the width center line of the beam. If an even number of metal wirings are arranged on the beam, the provision of the same number of metal wirings on each of the two frame sides of the framed stress damping section makes it easy for the right and left first and second portions sandwiching the stress damping section to be deformed symmetrically, when the acceleration sensor element undergoes disturbance force to deform the stress damping section. This effect equates forces exerted on the piezoresistance elements located at both ends of the beam, does not greatly upset resistance balance even upon assembly of the bridge, and can reduce output changes due to disturbance force.

With the acceleration sensor of the present invention, it is preferred that dummy metal wiring not connected to the semiconductor piezoresistance elements be formed on the frame side of the framed stress damping section, and the metal wirings be arranged on both frame sides of the stress damping section symmetrically with respect to the width center line of the beam.

If an odd number of metal wirings are provided on the beam, the middle metal wiring can be divided and branched into two pieces to equate the number of the metal wirings on the respective frame sides of the framed stress damping section and achieve symmetry. When the single metal wiring is branched into the two lines, the width of the branched metal wiring is preferably the same as the width of the metal wiring before branching. Division of the metal wiring into two decreases the width of the metal wiring, thus increasing the danger of breakage occurring in the metal wiring. Alternatively, two metal wirings are provided on one hand, and one metal wiring is provided on the other hand, instead of the metal wiring being divided and branched, and dummy metal wiring not connected to the semiconductor piezoresistance elements is formed on the single metal wiring side. By so doing, the structure of the frame can be rendered symmetrical.

With the acceleration sensor of the present invention, it is preferred that the first portion and the second portion of the beam, where the stress damping section is provided, each comprise a first root portion connecting the first or second portion to the weight or the support frame, a second root portion connecting the first or second portion to the stress damping section, and a varying width portion gradually varying in width from the first root portion until the second root portion, the first root portion should have the piezoresistance elements which the beam has, and the width W$32a$ of the first root portion be larger than the width W$6$ of each of the first and second frame sides in the direction in which the entire beam extends.

The stress damping section deforms upon exertion of external force, absorbing disturbance force exerted in the direction in which the entire beam extends. Thus, the stress damping section is preferably of such a shape as to be easily deformed by disturbance force exerted in the direction in which the entire beam extends. The smaller the width and the larger the length of the frame sides extending in the width direction of the beam among the frame sides of the stress damping section, the easier the stress damping section is deformed. Compared with the first root portion having the piezoresistance elements formed thereon and many metal wirings provided thereon, the frame sides of the stress damping section are provided with the branched metal wiring, so that their width can be decreased. By making the width of the frame sides small, these frame sides are easily deformed by disturbance force exerted in the direction in which the entire beam extends. Consequently, the stress damping effect of the stress damping section can be enhanced.

With the acceleration sensor of the present invention, it is preferred that the width W$32a$ of the first root portion be larger than the width W$32b$ of the second root portion, and the width W$32b$ of the second root portion be larger than the width of each of the first and second frame sides in the direction in which the entire beam extends.

The same number of metal wirings are formed on the first root portion and the second root portion of the beam. In the first root portion, however, the piezoresistance elements are formed, and the P type wirings increased in electrical conductivity upon implantation of high concentration ions and metal wirings are formed in order to connect the piezoresistance elements. Thus, it is necessary to render the width W$32a$ of the first root portion larger than the width W$32b$ of the second root portion of the beam. That is, the width of the second root portion can be rendered smaller than the width of the first root portion. Thus, the second root portion smaller in width than the first root portion is provided, and the second root portion and the stress damping section are connected, whereby the length of the frame sides extending in the width direction of the beam can be made larger by the amount of constriction of the second root portion, even when the dimensions of the stress damping section are not changed. This is substantially the same method as that of extending the stress damping section in the width direction of the beam. Since the stress damping section needs to be formed so as not to contact the weight, there may be a case where the width of the stress damping section in the width direction of the beam is increased. In this case, it becomes necessary to render the width of the notch formed in the weight larger than the width of the stress damping section provided in the beam with the use of the portion of the beam led out of the weight. As a result, the volume of the weight is decreased correspondingly to lower the sensitivity. By fulfilling the relationship—width W$6$ of frame side<width W$32b$ of second root portion<width W$32a$ of first root portion—, the stress damping effect can be enhanced by the stress damping section without a decrease in the volume of the weight.

When the acceleration sensor of the present invention has the stress damping section comprising sides connected zigzag, it is preferred that the first portion and the second portion of the beam, where the stress damping section is provided, each comprise a first root portion connecting the first or second portion to the weight or the support frame, a second root portion connecting the first or second portion to the stress damping section, and a varying width portion gradually varying in width from the first root portion until the second root portion, the first root portion should have the semiconductor piezoresistance elements which the beam has, and the width W$32a$ of the first root portion be larger than the width W$6'$ of each of the first and second sides in the direction in which the entire beam extends.

Further, it is preferred that the width W$32a$ of the first root portion be larger than the width W$32b$ of the second root portion, and the width $32b$ of the second root portion be larger than the width W$6'$ of each of the first and second sides in the direction in which the entire beam extends.

In the case of the stress damping section comprising the sides connected zigzag, the same number of metal wirings are formed on the first root portion and the second root portion of the beam. In the first root portion, however, the piezoresistance elements are formed, and the P type wirings increased in electrical conductivity upon implantation of high concentration ions and metal wirings need to be formed in order to connect the piezoresistance elements. For this purpose, it is necessary to render the width of the first root portion of the beam larger than the width of the second root portion. That is, the width of the second root portion can be rendered smaller than the width of the first root portion. By making the width W$32b$ of the second root portion smaller than the width W$32a$ of the first root portion, therefore, the sides of the zigzag-shaped stress damping section extending in the width direction of the beam can be lengthened, with the dimensions of the stress damping section being maintained. This is substantially the same method as that of extending the stress damping section in the width direction of the beam. Since the stress damping section needs to be formed so as not to contact the weight, there may be a case where the width of the stress damping section in the width direction of the beam is increased. In this case, it becomes necessary to render the width of the notch formed in the weight larger than the width of the stress damping section provided in the beam with the use of the portion of the beam led out of the weight. As a result, the volume of the weight is decreased correspondingly to lower the sensitivity. By fulfilling the relationship width W$6'$ of side width W$32a$ of first root portion, the stress damping effect by the stress damping section can be enhanced without a decrease in the volume of the weight. By decreasing the width WE' of the sides extending in the width direction of the beam among the zigzag connected sides, moreover, deformation easily occurs in response to disturbance force exerted in the direction in which the entire beam extends, whereby the stress damping effect can be rendered higher.

The acceleration sensor of the present invention is a multirange sensor chip having two or more acceleration sensor elements formed in the same chip (i.e., a multirange acceleration sensor element), and the plurality of acceleration sensor elements in the multirange sensor chip can achieve an output voltage per unit acceleration which decreases in the sequence of the first to nth acceleration sensor elements.

With the acceleration sensor element, the beam deforms by the action of acceleration on the weight, and stress occurs in the piezoresistance elements formed in the beam. Their electrical resistance changes, and this change is converted into a potential difference (output voltage), which is outputted. The first to nth acceleration sensor elements are formed such that their output voltage per unit acceleration decrease in this order. For example, the first acceleration sensor element of a measurement range of ±3 G is set to show an output voltage, per acceleration 1 G, of 1V, and the nth acceleration sensor element of a measurement range of 300 G is set to show an output voltage, per acceleration 1 G, of 0.01V. By so doing, the full range of the output voltage corresponding to the measurement range of each acceleration sensor element can be adjusted to ±3V. If each ±3V is detected with the same resolution, high accuracy detection can be carried out in each of the different acceleration ranges. The output per unit acceleration of each acceleration sensor element is set such that in the measurement range the output voltage is in a region where linearity is maintained. If too high an output voltage per unit acceleration is set for the sensor element of a broad measurement range, there is a possibility that deformation of the beam will reach a nonlinear region within the measurement range, failing to maintain linearity of the output voltage.

The first to nth acceleration sensor elements are formed in the same chip. Thus, individual manufacturing steps are not needed for forming the respective elements. The shape of each element is graphically drawn in a photomask, and then the respective elements are formed in a lump using the photolithography and etching steps, whereby these elements can be produced at a low cost. The beams of the acceleration sensor elements in the same chip are preferably of the same thickness. Further, the weight and the support frame preferably have the same thickness. Moreover, the weight and the support frame preferably have the same thickness. By rendering these thicknesses identical among the respective elements, simplification of the steps can be achieved, and the elements can be produced at a low cost.

It is preferred that the mass of the weight decreases, the length of the beam decreases, and/or the width of the beam increases in the sequence of the first to nth acceleration sensor elements.

Preferably, at least one of the second to nth acceleration sensor elements has the support frame, the weight held by the support frame via the paired beams, the piezoresistance elements provided in the beams, and the wirings interconnecting them. Preferably, two biaxial acceleration sensor elements capable of detecting acceleration along the first axis within the plane where the beams are formed, and acceleration along the second axis nearly perpendicular to the plane, are disposed such that the first axes are orthogonal to each other. The biaxial acceleration sensor element is different from a triaxial acceleration sensor element in that the paired beams are a pair of the beams. Acceleration in the first axis (X-axis) in which the entire beam extends, and acceleration in the second axis (Z-axis) perpendicular to the chip surface can be detected by the semiconductor piezoresistance elements formed in the beams. The arrangement of the two biaxial acceleration sensor elements such that their first axes cross at right angles makes it possible to detect accelerations in three axes, i.e., two axes (X- and Y-axes) in the first-axis direction, and Z-axis, of the two elements. Detection of the acceleration in the Z-axis can be performed by any one of the two elements. Alternatively, the Z-axis acceleration can be detected using both elements. On the other hand, the triaxial acceleration sensor element has two pairs of beams, one pair orthogonal to the other pair, and can detect accelerations in the two axes (X- and Y-axes) in the directions in which the respective beams as a whole extend, and the axis perpendicular to the chip surface (i.e., Z-axis). Detection of the acceleration in the Z-axis can be performed by any one pair of the two pairs of beams. Alternatively, the Z-axis acceleration can be detected using both elements.

The biaxial acceleration sensor element has a pair of beams. Thus, the total flexural rigidity of the beams is lower than that of the triaxial acceleration sensor element having two pairs of beams, and the dimensions of the weight can be rendered small in order to obtain the same output voltage per unit acceleration. Since the beams also extend only in one direction, the biaxial acceleration sensor element can be accommodated within a smaller frame. The total area of the two biaxial acceleration sensor elements is larger than the area of the triaxial acceleration sensor element, but the second and subsequent acceleration sensor elements are rendered two biaxial elements, which are arranged around the first triaxial acceleration sensor having the largest dimensions. By so doing, the dimensions of the entire multirange acceleration sensor element can be made small. That is, the first acceleration sensor element is triaxial with this single element, and it can be selected whether the second and subsequent acceleration sensor elements are triaxial for each element, or two biaxial acceleration sensor elements.

The total flexural rigidity of the beams is lower for the pair of beams than for the two pairs of beams, but the degree differs between the X- and Y-axes and the Z-axis. In regard to the X- and Y-axis directions, when there are two pairs of beams, one of the pairs undergoes flexural deformation, while the other pair undergoes torsional deformation. Since torsional deformation results in low rigidity, an increase in rigidity of the beams as a whole ascribed to the increase from the one pair to the two pairs is two-fold for the Z-axis, but is only an increase of the order of 10 to 20% for the X- and Y-axes. Hence, there may be a configuration in which only the detection for the Z-axis is performed by the acceleration sensor element having one pair of beams, and the detection for the X- and Y-axes is performed by the other acceleration sensor element having two pairs of beams. If it is difficult to bring sensitivity in the X- or Y-axis and sensitivity in the Z-axis into agreement with the use of one acceleration sensor element, detection for the X- or Y-axis and detection for the Z-axis are carried out by different acceleration sensor elements. By this measure, the dimensions can be adjusted individually, and sensitivities in the three axes become easily coincident.

The beam type acceleration sensor element has been described above, but a diaphragm type acceleration sensor element can be used, and the diaphragm type and the beam type can be combined.

Effects of the Invention

According to the acceleration sensor of the present invention, disturbance force exerted in the direction in which the entire beam extends can be absorbed by the stress damping section formed in the beam. Thus, the influence of the disturbance force exerted on the acceleration sensor element can be reduced. By reducing the influence of the disturbance force, changes in the sensitivity of the acceleration sensor can be diminished. In this manner, an acceleration sensor having characteristics stable to disturbance force was successfully provided.

BRIEF DESCRIPTION OF THE DRAWINGS

FIGS. 10A, 103 and 10C show, in plan views, multirange acceleration sensor elements of Embodiment 5 which have the stress damping sections according to the present invention applied thereto.

DESCRIPTION OF THE NUMERALS AND SYMBOLS

Figure 1:
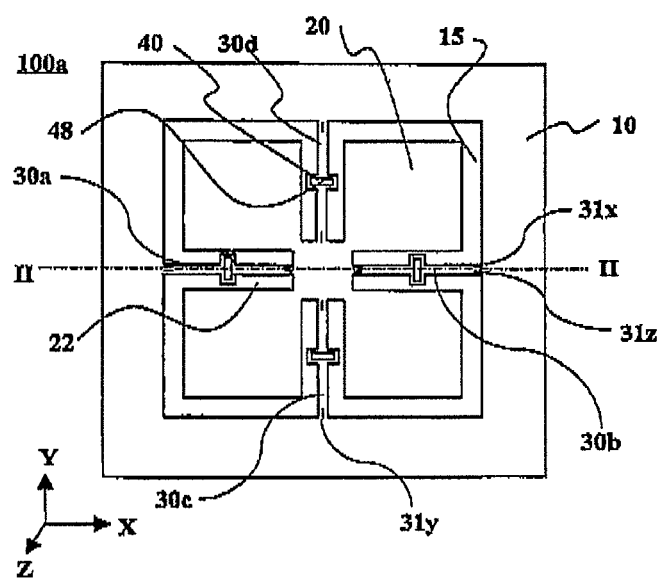
FIG. 1 is a plan view showing an acceleration sensor element of Embodiment 1 according to the present invention.

100a Acceleration sensor element
10 Support frame
20 Weight
30, 30a, 30b, 30c, 30d Beam
31, 31x, 31y, 31z Semiconductor piezoresistance element
32 First portion (of beam)
32. First root portion
32b Second root portion
32c Varying width portion
34 Second portion (of beam)
36 Third portion (of beam)
38, 38a, 38b, 38c Wiring
40, 40' Stress damping section
42a First frame side
42b Second frame side
42c Third frame side
42d Fourth frame side
42a' First side
42b' Second side
42c' Third side
42d' Fourth side
42e' Fifth side
48 Opening
m-m' Longitudinal or length center line of beam
n-n' Lateral or width center line of beam
p Point of intersection

BEST MODE FOR CARRYING OUT THE INVENTION

The present invention will now be described in detail based on its embodiments with reference to the accompanying drawings. To facilitate the descriptions, the same numerals or symbols are used on the same components and sites.

Embodiment 1

Figure 2:
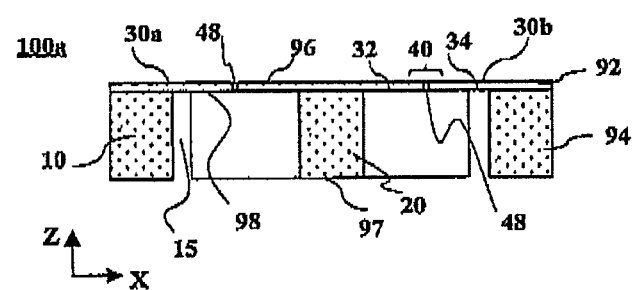
FIG. 2 is a sectional view along line II-II in FIG. 1.

An acceleration sensor according to Embodiment 1 of the present invention will be described below. FIGS. 1 and 2 show the structure of an acceleration sensor element used in the acceleration sensor of embodiment 1. FIG. 1 is a plan view of an acceleration sensor element 100*a*, and FIG. 2 is a sectional view taken along line 11-11 in FIG. 1. The acceleration sensor element can be applied, for example, to an acceleration sensor 200 assembled as shown in an exploded perspective view of FIG. 15, and an acceleration sensor 300 shown in FIG. 14 which has been hermetically sealed with a cap and then assembled into a resin package. Since the present invention is characterized, particularly, by the structure of the acceleration sensor element, a detailed explanation will be offered for the acceleration sensor element below.

In the acceleration sensor element 100*a*, a weight 20 is provided in the center of a space 15 surrounded by a support frame 10, and notches 22 are formed in the centers of respective sides present in the surroundings of the weight 20. The weight 20 is supported by the support frame 10 via a first beam 30*a*, a second beam 30*b*, a third beam 30*c*, and a fourth beam 30*d* (these are collectively referred to as beams 30) which extend from an inner side of the support frame 10 up to the deepest ends of the notches 22 formed in the sides around the weight 20 and which have flexibility. In FIG. 1, the first beam 30*a* and the second beam 30*b* detect accelerations in the X-axis and z-axis directions, and X-axis acceleration detecting semiconductor piezoresistance elements 31*x* (hereinafter referred to as "X-axis piezoresistance elements 31*x*" or "piezoresistance elements 31*x*") and z-axis acceleration detecting semiconductor piezoresistance elements 31*z* (hereinafter referred to as "Z-axis piezoresistance elements 31*z*" or "piezoresistance elements 31*z*") are formed at the ends of the beams 30. Semiconductor piezoresistance elements 31*y* for detecting acceleration in the Y-axis direction (hereinafter referred to as "Y-axis piezoresistance elements 31*y*" or "piezoresistance elements 31*y*") are formed on the third beam 30*c* and the fourth beam 30*d* arranged perpendicularly to the first beam 30*a* and the second beam 30*b* (i.e., in the Y-direction). The Z-axis piezoresistance elements 31*z* can be arranged on the beams along either the X-axis or the Y-axis, but in the present embodiment, were formed on the first beam 30*a* and the second beam 30*b* along the X-axis. The piezoresistance elements 31*x*, 31*y*, 31*z* (may be collectively referred to as "piezoresistance elements 31") were formed in the vicinity of the roots of the beams along the respective axes. The four piezoresistance elements for detecting acceleration along each axis were interconnected by metal wirings (not shown) to constitute a bridge circuit. When acceleration is applied to the acceleration sensor element 100*a* by external force, the weight 20 is displaced, and the beams 30 are deformed, whereby the electrical resistances of the piezoresistance elements are changed. A potential difference produced by the difference in the amount of the change in the resistance among the four piezoresistance elements which detect acceleration along each axis is withdrawn by the bridge circuit, and thereby can be detected as the value of acceleration. A framed stress damping section 40 is provided nearly in the center of the length of each of the first beam 30*a* to the fourth beam 30*d*. The framed stress damping section 40 has an opening 48 in the center of a frame.

The production of the acceleration sensor element 100*a* will be explained briefly with reference to FIG. 2. FIG. 2 is a sectional view taken on line II-II in FIG. 1. An SOI wafer having a silicon oxide film layer about 1 μm thick and a silicon layer having a thickness of about 6 μm laminated on a silicon layer with a thickness of about 400 μm was used. The silicon oxide film layer was used as an etching stop layer for dry etching, and an acceleration sensor element was formed in the two silicon layers. The thin silicon layer was designated as a first layer 92, and the thick silicon layer was designated as a second layer 94. A surface of the first layer which was not joined to the silicon oxide film layer was designated as a first surface 96. A surface of the second layer which was not joined to the silicon oxide film layer was designated as a second surface 97. A connected surface for connection via the silicon oxide film layer was designated as a third layer 98. The shapes of piezoresistance elements were patterned using a photoresist, and the first surface 96 was implanted with boron in an amount of 1 to $3\times10^{18}$ atoms/cm$^3$ to form piezoresistance elements. A silicon oxide film was formed on the first surface 96 to protect the piezoresistance elements. Metal wirings for connecting the piezoresistance elements were formed by sputtering an aluminum-based metal on the silicon oxide film. The silicon oxide film formed on the first surface 96 also works as an insulating film between the silicon of the first layer and the metal wirings. The insulating film and the metal wirings were processed into desired shapes by photolithography. Then, after the photoresist pattern was formed in the first surface 96, the shapes of the support frame 10, the weight 20, and the beams 30 were processed by dry etching. Further, a photoresist pattern was formed in the second surface 97, whereafter the shapes of the weight 20 and the support frame 10 were processed by dry etching. The silicon oxide film layer remaining between the first layer and the second layer was removed by wet etching. According to this procedure, many acceleration sensor elements are formed in one wafer. Thus, the acceleration sensor elements 100*a*, which were individualized and formed into chips, were obtained by dry etching or dicing.

Figure 3A:
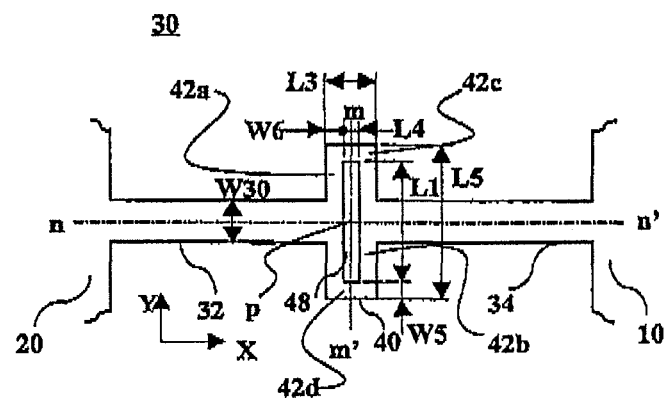
FIGS. 3A to 3C show details of a beam of the acceleration sensor element of Embodiment 1 according to the present invention, FIG. 3A being an enlarged plan view of the beam, FIG. 3B being a plan view showing a stress damping section with a frame provided in the beam, and FIG. 3C being a plan view showing the stress damping section with another frame.

As shown in FIG. 1, the stress damping section 40 is provided on the beam outside the regions where the piezoresistance elements are provided, and nearly in the center of the length of the beam 30. The framed stress damping section 40 was formed in the first layer 92 in the same manner as for the beam 30, and had the same thickness as that of the beam 30. By reference to FIG. 3A, the framed stress damping section 40 is a quadrilateral frame comprising two frame sides extending in the width direction of the beam 30, i.e., a first frame side 42*a* and a second frame side 42*b*, and two frame sides extending in the direction in which the beam 30 extends, i.e., a third frame side 42*c* and a fourth frame side 42*d*, and has the opening 48 in the center of the frame. As shown in FIG. 2, in the sectional view taken on line II-II in FIG. 1, the beam 30 is divided into a first portion 32 and a second portion 34 by the opening 48 present in the frame of the stress damping section 40. As shown in FIG. 3A, it is desirable that the stress damping section 40 be formed symmetrically with respect to the point of intersection, p, between the longitudinal or length center line m—m' of the beam 30 and the lateral or width center line n-n' of the beam 30. When the beam 30 deforms under disturbance force, deformation of the first portion 32 of the beam and deformation of the second portion 34 of the beam, with the stress damping section 40 sandwiched therebetween, become symmetrical, if the stress damping section 40 is provided to be symmetrical with respect to the center of the beam 30. Thus, changes in the stress of the piezoresistance elements 31 disposed at both ends of the beam 30 are easily rendered coincident. The uniform resistance change of the piezoresistance elements can be cancelled by the bridge circuit, so that an output change due to the disturbance force can be decreased.

FIG. 3A shows, in an enlarged manner, the beam 30 having the framed stress damping section 40. If the stress damping section 40 is in such a shape that it is apt to undergo flexural deformation and torsional deformation in the direction in which the beam 30 extends, its effect of absorbing disturbance force is great. An internal distance L1 between the third frame side 42*c* and the fourth frame side 42*d* extending in the direction in which the beam extends (i.e., X-direction) is larger than the width W30 of the beam 30. The stress damping section 40 is symmetrical with respect to the point of intersection p between the length center line m-m' and the width center line n-n' of the beam 30. An internal distance L4 between the first frame side 42a and the second frame side 42b extending in the width direction of the beam (Y-direction) was 18 μm, and an external distance L3 between them was 40 μm. The internal distance L1 between the third frame side 42c and the fourth frame side 42d extending in the direction in which the beam extended (i.e., X-direction) was 60 μm, and an external distance L5 between them was 80 μm. The width W6 of each of the first frame side 42a and the second frame side 42b extending in the width direction of the beam was 11 μm, the width W5 of each of the third frame side 42c and the fourth frame side 42d extending in the direction in which the beam extended was 11 μm, and the width W30 of the beam 30 was 22 μm. The distance between the support frame 10 and the weight 20, namely, the length of the beam 30, was 400 μm, and the first portion 32 and the second portion 34 of the beam both had a length of 180 μm.

Figure 3B:
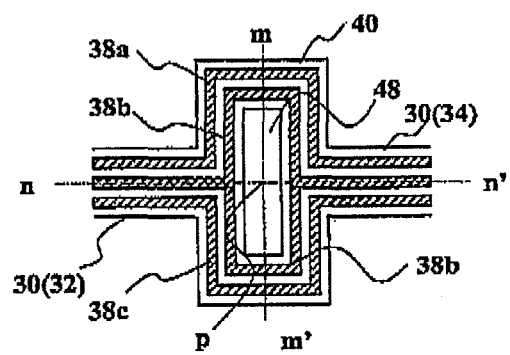
Figure 3C:
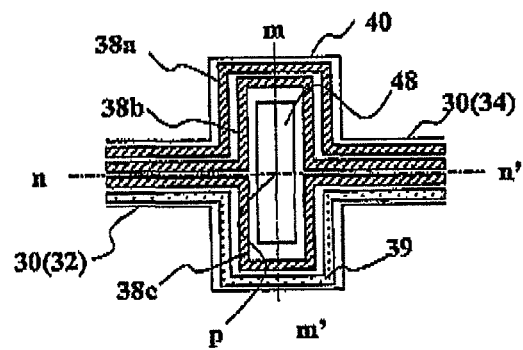

Metal wirings 38a, 38b, 38c for connecting the piezoresistance elements and electrode pads for leading to the outside are shown partially in FIGS. 3B and 3C. The metal wirings withdrawn from the piezoresistance elements formed at the roots of the beam 30 facing the weight are passed on the beam 30 and pulled out onto the support frame. Stress generated by the metal wirings 38a to 38c is preferably symmetrical with respect to the length center line m-m' and the width center line n-n' of the beam. FIG. 3B shows the metal wirings provided on the beam of Embodiment 1, and the central metal wiring 38b of an odd number of the metal wirings is disposed in a divided form on the upper and lower frame sides. FIG. 3C shows another form of Embodiment 1, in which dummy metal wiring 39 not connected to the piezoresistance elements is formed on one frame side. FIGS. 3B and 3C each show a case where three metal wirings, 38a to 38c, are provided. In FIG. 3B, the metal wiring 38a and one half of the metal wiring 38b disposed dividedly were arranged on the frame side of the stress damping section 40 shown in the upper part of the drawing, whereas the metal wiring 38c and the other half of the metal wiring 38b disposed dividedly were arranged on the frame side of the stress damping section 40 shown in the lower part of the drawing. In FIG. 3C, the metal wirings 38a and 38b were formed on the frame side of the stress damping section 40 shown in the upper part of the drawing, whereas the metal wiring 38c and the dummy metal wiring 39 were formed on the frame side of the stress damping section 40 shown in the lower part of the drawing. The material for, and the wiring width and the wiring thickness of, the dummy metal wiring 39 were the same as those of the metal wirings 38a to 38c.

Figure 4A:
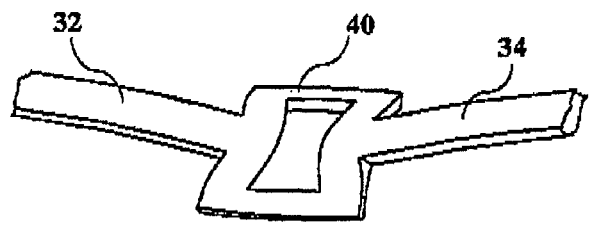
FIG. 4A is a perspective view of the beam used in Embodiment 1 which schematically shows the deformation of the stress damping section when compressive disturbance force is exerted on the beam.
Figure 4B:
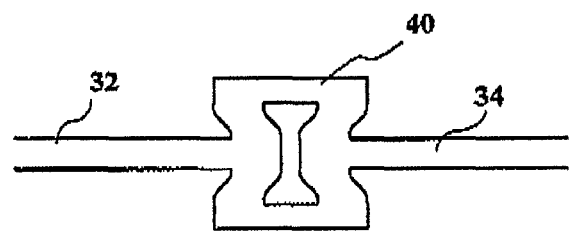
FIG. 4B is a plan view of the beam used in Embodiment 1 which schematically shows the deformation of the stress damping section when compressive disturbance force is exerted on the beam.
Figure 5A:
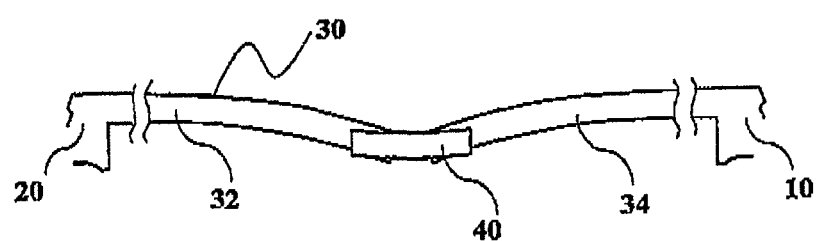
FIG. 5A is a side view of the beam used in Embodiment 1 which schematically shows the deformation of the beam when compressive disturbance force is exerted on the beam.
Figure 5B:
FIG. 5B is a sectional view of a conventional beam which schematically shows the deformation of the beam when compressive disturbance force is exerted on the beam.

With the acceleration sensor element of the present embodiment, when disturbance force is exerted in the direction in which the beam extends, the stress damping section absorbs the disturbance force. Thus, a change in the detection sensitivity of the acceleration sensor could be curtailed. The actions of the stress damping section 40 will be described in detail using FIGS. 4A, 4B and 5A, 5B. FIG. 4A is a perspective view schematically showing the deformation of the stress damping section 40 when compressive disturbance force is exerted in the direction in which the beam extends. A schematic plan view of the stress damping section 40 is shown in FIG. 4B. The frame sides of the framed stress damping section 40 connected to the different portions of the beam undergo flexural deformation, and thus absorb compressive force caused to the first portion 32 and the second portion 34 in the direction in which the beam extends. FIGS. 5A and 5B show sectional schematic views of the beam. FIG. 5A is the sectional schematic view of the beam 30 having the framed stress damping section 40 nearly centrally of the beam 30 of Embodiment 1. FIG. 5B shows, in a sectional schematic view, a conventional beam 12 continuing from the weight 20 to the support frame 10. A comparison between FIG. 5A and FIG. 5B clearly shows the difference in the deformation of the beam. In the beam 30 of the present embodiment, as shown in FIG. 5A, the framed stress damping section 40 undergoes torsional deformation, whereby the first portion 32 and the second portion 34 of the beam located on both sides of the stress damping section 40 become easily deformable in a flexural manner in the thickness direction. Their bending has the effect of relieving the compressive force further easily. When tensile or compressive stress is imposed in the direction, in which the beam extends, by the disturbance force, deformability of the beam changes because of acceleration imposed on the weight. Thus, the sensor output per unit acceleration, namely, sensitivity, changes. With the acceleration sensor of the present invention, even if disturbance force is exerted in the direction in which the beam extends, the stress damping section absorbs the disturbance force, thereby making it difficult for the stress in the direction of extension of the beam to change. Hence, it became possible to obtain an acceleration sensor whose sensitivity minimally changes responsive to disturbance force.

With the acceleration sensor element, the insulating film and the wirings are formed on the surface of the beam. Since they are different in the coefficient of thermal expansion from silicon, the material for the beam, they generate thermal stress in response to a temperature change during the course from the film deposition temperatures of the insulating film and the wirings to cooling to room temperature. This thermal stress becomes disturbance force. The stress of the insulating film is predominant, and the silicon oxide film has a smaller coefficient of thermal expansion than that of silicon. Thus, the beam tends to warp in a direction in which the surface side with the insulating film convexes. In the case of the continuous beam without the stress damping section, the curvature of the beam is continuous, so that a certain portion of the beam (cannot be specified, because it differs according to the magnitude of the stress) warps in a direction opposite to the natural direction of warpage. If the middle of the beam warps in the opposite direction, a downward convexity as shown in FIG. 5B appears. This shape is so unstable that, depending on the direction in which acceleration is applied, it tends to shift to an upward convexity or to a shape in which the weight is displaced upward or downward. If the disturbance force changes in such a state, the deformability of the beam easily changes, thus aggravating a sensitivity change due to the disturbance force. With the acceleration sensor of the present embodiment, the stress damping section 40 serves as the point of inflection, as shown in FIG. 5A, because of the effect of the torsional deformation of the stress damping section. As a result, the beam takes a stable shape in which most of the first portion 32 and the second portion 34 of the beam deform in a natural warping direction. Thus, it is difficult for the beam to shift into other deformation, so that the change in sensitivity due to disturbance force can be rendered small.

Embodiment 2

Figure 6:
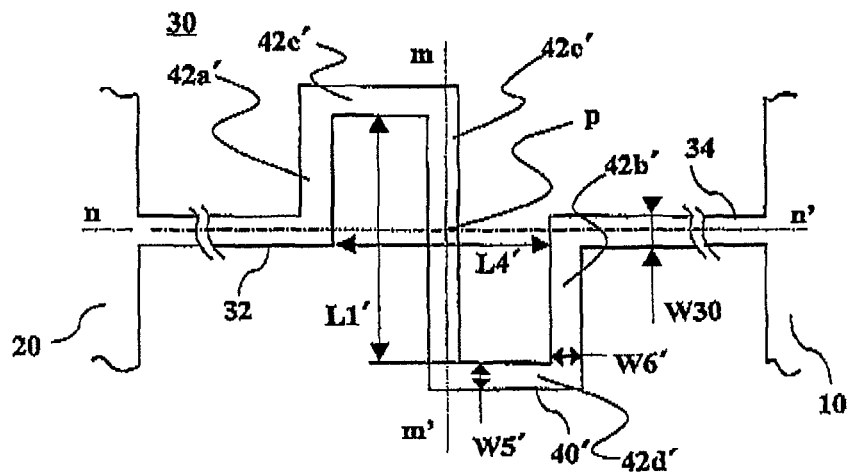
FIG. 6 is a plan view showing a beam having a stress damping section comprising sides connected zigzag, the stress damping section being used in Embodiment 2 according to the present invention.

An acceleration sensor according to Embodiment 2 of the present invention will be described below. Its difference from Embodiment 1 is that the stress damping section has a zigzag structure. The beam structure of Embodiment 2 is shown in FIG. 6 as a plan view. As with the beam, the stress damping section is formed in the first layer of the SOI wafer, and thus has the same thickness as the beam. A stress damping section 40' has a zigzag structure comprising a plurality of straight sides connected orthogonally at their ends, and is symmetrical with respect to its center. That is, the stress damping section 40' is symmetrical with respect to the point of intersection p between the length center line m-m' of the beam 30 and the width center line n-n' of the beam 30.

The stress damping section 40' in the zigzag configuration will be described in detail with reference to FIG. 6. A beam 30 linking a support frame 10 and a weight 20 is composed of the stress damping section 40' provided in the center of the beam, a first portion 32 of the beam connecting the weight 20 and the stress damping section 40', and a second portion 34 of the beam connecting the stress damping section 40' and the support frame 10. In the vicinity of the junction of the first portion 32 with the weight 20, piezoresistance elements (not shown) are provided on the first portion 32. In the vicinity of the junction of the second portion 34 with the support frame 10, piezoresistance elements (not shown) are provided on the second portion 34. From the end of the first portion 32 opposite to its end where the weight 20 is connected, a first side 42a' extends upward in the width direction of the beam (Y-direction). From the upper end of this side, an upper third side 42c' extends to the length center line m-m' of the beam 30 in the direction in which the beam extends (i.e., X-direction). From the end of the second portion 34 of the beam opposite to its end where the support frame 10 is connected, on the other hand, a second side 42b' extends downward in the width direction of the beam (Y-direction). From the lower end of the second side 42b', a lower fourth side 42d' extends to the length center line m-m' of the beam 30 in the direction in which the beam extends (i.e., X-direction). A fifth side 42e', which extends in the width direction of the beam (Y-direction), connects the end of the upper third side 42c' located on the center line m-m' and the end of the lower fourth side 42d' located on the center line m-m'. If the stress damping section 40' is in such a shape that it is apt to undergo flexural deformation and torsional deformation in the direction in which the beam extends, its effect of absorbing disturbance force is great. An internal distance L1' between the third side 42c' and the fourth side 42d' among the sides connected in the zigzag form is larger than the width W30 of the beam 30. It is preferred that the sides connected in the zigzag form be symmetrical with respect to the center of the stress damping section 40'. Thus, the dimensions of the respective portions were set as follows: The internal distance L1' between the third side 42c' and the fourth side 42d' extending in the direction in which the beam extends is 60 μm. The width W30 of the beam is 22 μm. An internal distance L4' between the first side 42a' extending upward and the second side 42b' extending downward in the width direction of the beam is 46 μm. An L3' between the same two sides (the length of the stress damping section 40') is 90 μm. The width WE of each of the third side 42c' and the fourth side 42d' extending in the direction in which the beam extends is 22 μm. The width W6 of each of the first side 42a' and the second side 42b' extending in the width direction of the beam is 22 μm. The corner at the junction between the sides connected zigzag was provided with curvature with a radius of 5 μm.

Like the framed stress damping section, the zigzag-shaped stress damping section undergoes flexural deformation and torsional deformation in the direction in which the beam extends. Thus, the force exerted on the beam in the direction in which the beam extends could be absorbed, and the change in sensitivity due to disturbance force could be curtailed. With the framed stress damping section of Embodiment 1, the frame of the stress damping section responds as a unit to disturbance force, and deforms as a whole. With the zigzag-shaped stress damping section of the present embodiment, the junctions of the third side 42c' and the fourth side 42d' located on both sides can deform individually. In other words, the sides connected zigzag divide the beam at two locations, so that the effect of absorbing disturbance force can be rendered high. On the other hand, rigidity against bending in the width direction of the beam is so low that the beam is liable to flexural deformation in the width direction of the beam. If such flexural deformation occurs, symmetry with respect to the length center line m-m' of the beam is lost. This is not desirable. However, the provision of folded-back sections on both sides can prevent the occurrence of bending only in one direction, i.e., in the width direction of the beam.

The stress damping section 40' is symmetrical with respect to the point of intersection p between the length center line m-m' of the beam and the width center line n-n' of the beam. When the beam 30 is subject to external force and is deformed, therefore, deformation of the first portion 32 of the beam and deformation of the second portion 34 of the beam, with the stress damping section 40' sandwiched therebetween, are symmetrical. By so rendering deformations of the right and left parts of the beam identical, changes in stress of the piezoresistance elements arranged at both ends of the beam tend to be equal, so that output changes due to disturbance force can be rendered small.

Embodiment 3

Figure 7A:
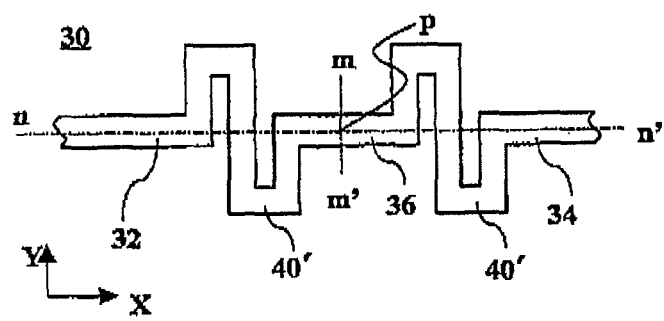
FIGS. 7A, 7B show a beam used in an acceleration sensor of Embodiment 3 according to the present invention, FIG. 7A being a plan view of the beam having two stress damping sections comprising sides connected zigzag, and FIG. 7B being a side view showing the beam of FIG. 7A when compressive disturbance force is exerted on the beam.

An acceleration sensor according to Embodiment 3 of the present invention will be described below. The structure of the beam of Embodiment 3 is shown in FIG. 7A as a plan view. A beam 30 of FIG. 7A has two stress damping sections 40' each comprising zigzag-connected sides, and the respective stress damping sections 40' are called a first stress damping section and a second stress damping section. The beam 30 is separated into a first portion 32 of the beam linking the weight to the first stress damping section, a second portion 34 of the beam linking the second stress damping section to the support frame, and a third portion 36 of the beam linking the two stress damping sections 40'. Each stress damping section 40' in the zigzag configuration is the same as that of Embodiment 2 explained with reference to FIG. 6. The beam 30 having the two stress damping sections 40' is formed to be symmetrical with respect to the point of intersection p between the length center line m-m' and the width center line n-n' of the beam. The distance from the length center line m-m' of the beam to the center of each stress damping section 40' was 55 μm.

Figure 7B:
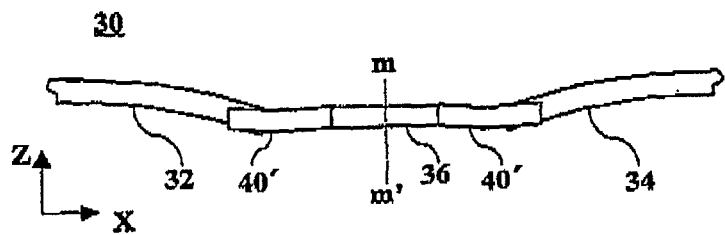

A side view schematically showing the deformations of these stress damping sections when compressive disturbance force was exerted in the direction in which the beam extended is FIG. 7B. Since the disturbance force is absorbed by the two stress damping sections 40', the third portion 36 of the beam between the two stress damping sections 40' deforms scarcely. The first portion 32 located between the weight and the first stress damping section 40', and the second portion 34 located between the support frame and the second stress damping section 40' deform symmetrically with respect to the length center line m-m' of the beam under the disturbance force. The symmetrical deformation results in the ease of coincidence between changes in stress of the piezoresistance elements provided on the weight side and the support frame side, thus enabling an output change due to the disturbance force to be decreased.

Embodiment 4

Figure 8A:
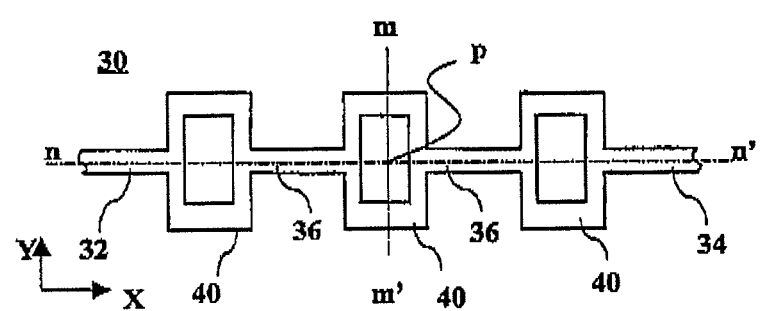
FIGS. 8A, 8B show a beam used in an acceleration sensor of Embodiment 4, FIG. 8A being a plan view of the beam having three framed stress damping sections, and FIG. 8B being a side view showing the deformation of the beam shown in FIG. 8A when compressive disturbance force is exerted on the beam.

An acceleration sensor according to Embodiment 4 of the present invention will be described below. The structure of the beam of Embodiment 4 is shown in FIG. 8A as a plan view. A beam 30 shown in FIG. 8A has three framed stress damping sections 40, and the respective stress damping sections are called a first stress damping section, a second stress damping section, and a third stress damping section. The beam 30 is divided into a first portion 32 of the beam linking the weight to the first stress damping section, a second portion 34 linking the third stress damping section to the support frame, and two third portions 36 linking the first and second stress damping sections and linking the second and third stress damping sections. Each stress damping section 40 is the same as that of Embodiment 1 explained with reference to FIG. 3. The beam 30 having the three stress damping sections 40 is formed to be symmetrical with respect to the point of intersection p between the length center line m-m' of the beam and the width center line n-n' of the beam. The distance from the length center line m-m' to the center of each of the first and third stress damping sections 40 was set at 30 μm.

Figure 8B:
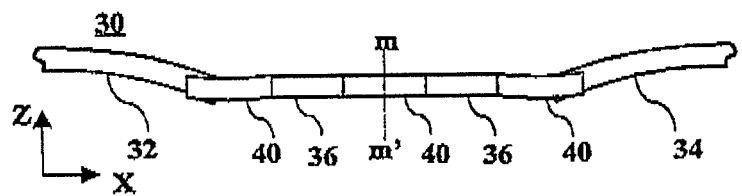

FIG. 8B schematically shows the deformation of the beam when compressive disturbance force was exerted in the direction in which the beam extended. Since the disturbance force is absorbed by the first and third stress damping sections 40 located outwardly, the two third portions 36 of the beam, which tie the two outward stress damping sections, i.e., the first and third stress damping sections, to the middle second stress damping section, show little deformation. The first portion 32 of the beam between the weight and the first stress damping section 40, and the second portion 34 of the beam between the support frame and the third stress damping section 40 deform symmetrically with respect to the length center line m-m' of the beam under the disturbance force. The symmetrical deformation results in the ease of coincidence between changes in stress of the piezoresistance elements provided on the weight side and the support frame side, thus enabling an output change due to the disturbance force to be decreased. Even if the disturbance force cannot be absorbed by the single stress damping section, deformation by the disturbance force can be absorbed by providing a plurality of the stress damping sections.

Embodiment 5

Figure 9A:
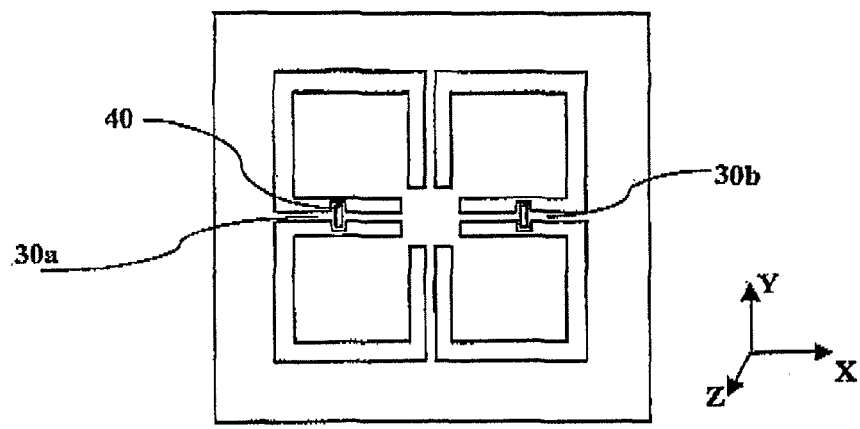
FIGS. 9A, 9B show acceleration sensor elements of Embodiment 4 in plan views, the plan views showing the structures of the acceleration sensor elements of the fourth embodiment, in which with the acceleration sensor element of FIG. 9A, the framed stress damping sections described in Embodiment 1 are provided only in the beams having semiconductor piezoresistance elements for detecting acceleration in the Z-axis direction, and with the acceleration sensor element of FIG. 9B, the stress damping sections described in Embodiment 2 comprising the sides connected zigzag are provided only in the beams having semiconductor piezoresistance elements for detecting acceleration in the Z-axis direction.
Figure 9B:
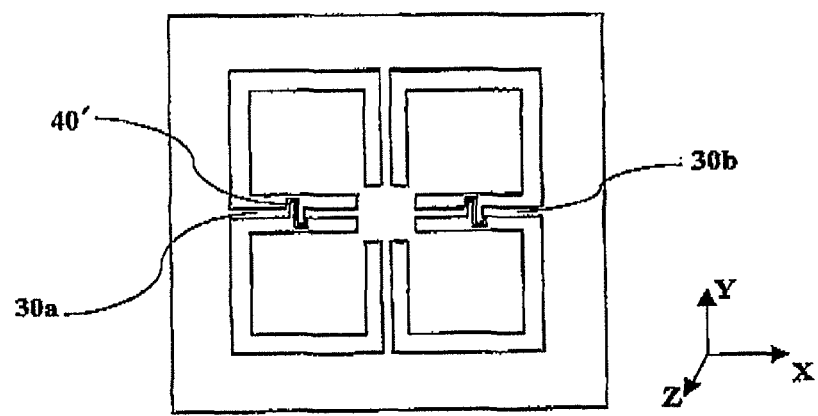

An acceleration sensor according to Embodiment 5 of the present invention will be described below. The structure of an acceleration sensor element of Embodiment 5 is shown in FIGS. 9A and 9B as plan views. This acceleration sensor element has stress damping sections 40, 40' formed only on a pair of beams among two pairs of beams. A change in sensitivity due to disturbance force exerted in the direction in which the beam extends is markedly influenced by acceleration working in the thickness direction of the beam (Z-direction). The influence due to accelerations in the X- and Y-axis directions is not so great as that exerted along the Z-axis. Thus, the stress damping sections 40, 40' were formed only on beams 30a, 30b having piezoresistance elements for detection of the Z-axis, as shown in FIGS. 9A, 9B. FIG. 9A illustrates the acceleration sensor element having the framed stress damping sections 40 formed on the beams 30a, 30b. FIG. 9B illustrates the acceleration sensor element having the zigzag-configured stress damping sections 40' formed on the beams 30a, 30b.

Embodiment 6

Figure 10A:
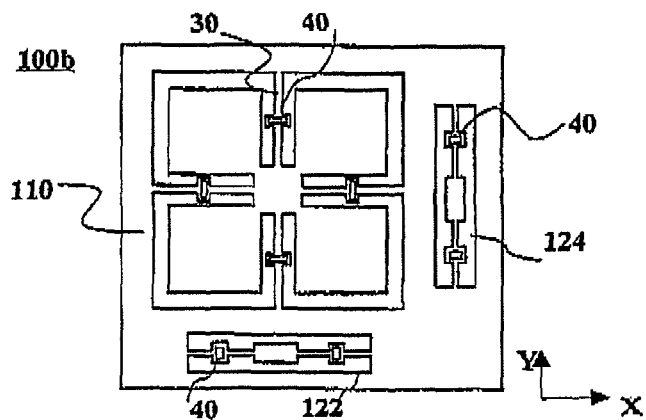
Figure 10B:
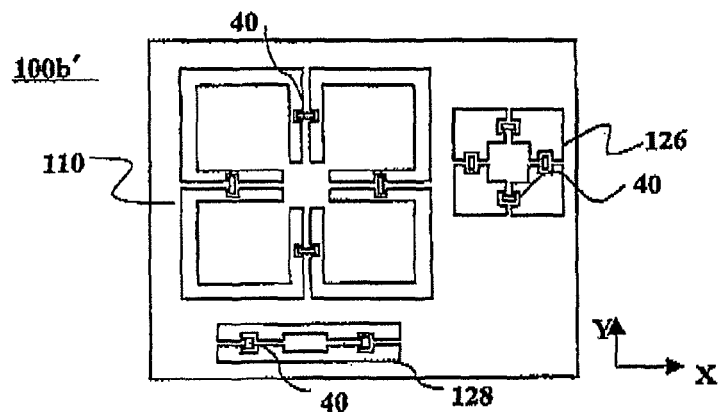
Figure 10C:
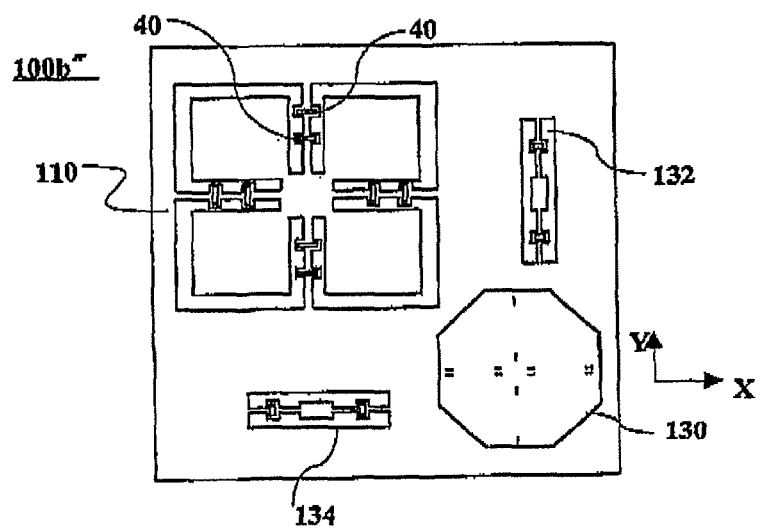

FIGS. 10A to 10C show, in plan views, multirange acceleration sensor elements having stress damping sections applied thereto. A multirange acceleration sensor element 100b has, for example, a plurality of acceleration sensor elements for measuring acceleration in a low range of ±several G and acceleration in a high range of t several hundred G, these acceleration sensor elements being formed in a single chip element. To perform the arrangement of the plurality of acceleration sensor elements densely, the high-range acceleration sensor element is often formed by combining uniaxial and biaxial acceleration sensor elements.

With the multirange acceleration sensor element 100b shown as a plan view in FIG. 10A, a low range (±several G) acceleration sensor element 110 and a high range (±several hundred G) acceleration sensor are formed in a single chip. In the low range acceleration sensor element 110, as in Embodiment 1, beams for detecting accelerations in the X-axis and the Z-axis and beams for detecting acceleration in the Y-axis are formed in the X-axis direction and the Y-axis direction, respectively, so as to cross, and framed stress damping sections 40 are provided in the respective beams 30. The high range acceleration sensor of ±several hundred G comprises a combination of a biaxial acceleration sensor 122 having beams formed in the X-axis direction for detecting accelerations in the X- and Z-axes, and a uniaxial acceleration sensor 124 having beams formed in the Y-axis direction for detecting acceleration in the Y-axis. The framed stress damping sections 40 are provided in the respective beams of the uniaxial acceleration sensor 124 and the biaxial acceleration sensor 122. With a multirange acceleration sensor element 100b' shown as a plan view in FIG. 10B, a low range (±several C) acceleration sensor element 110 and a high range acceleration sensor are formed in a single chip. The low range acceleration sensor element 110 is the same as that shown in FIG. 10A. The high range acceleration sensor comprises a combination of a biaxial acceleration sensor 126 having beams for detecting acceleration in the X-axis and beams for detecting acceleration in the Y-axis, these beams being crossed and formed in the X-axis direction and the Y-axis direction, respectively, and a uniaxial acceleration sensor 128 having only a pair of beams formed in the X-axis direction for detecting acceleration in the Z-axis. Framed stress damping sections 40 are provided in the four beams of the biaxial acceleration sensor 126 and the two beams of the uniaxial acceleration sensor 128. Since the biaxial acceleration sensor 126 has the four beams, it has a larger area than that of the acceleration sensor 124 shown in FIG. 10A. However, the biaxial acceleration sensor 126 detects the acceleration in the X-axis and the acceleration in the Y-axis, while the uniaxial acceleration sensor 128 detects the acceleration in the Z-axis. Thus, these acceleration sensors can be designed and produced independently, and it become easy to adjust the detection sensitivities for the X-, Y- and Z-axes. With a multirange acceleration sensor element 100b" shown as a plan view in FIG. 10C, a low range (±several G) acceleration sensor element 110, a medium range (±several tens of G) acceleration sensor element 130, and a high range (±several hundred G) acceleration sensor are formed in a single chip. In the low range acceleration sensor element 110, beams for detecting accelerations in the X-axis and the Z-axis and beams for detecting acceleration in the Y-axis are formed in the X-axis direction and the Y-axis direction, respectively, so as to cross, and two framed stress damping sections 40 are provided in each beam. The medium range acceleration sensor element 130 is a diaphragm type triaxial acceleration sensor element, and is not provided with the stress damping section. The high range acceleration sensor of ±several hundred G comprises a combination of a biaxial acceleration sensor 132 having beams formed in the Y-axis direction for detecting accelerations in the Y- and Z-axes, and a uniaxial acceleration sensor 134 having beams formed in the X-axis direction for detecting acceleration in the X-axis. The framed stress damping sections 40 are provided in the respective beams of the biaxial acceleration sensor 132 and the uniaxial acceleration sensor 134.

The multirange acceleration sensor elements 100b, 100b' and 100b" are each formed using an SOI wafer having a silicon oxide film layer about 1 μm thick and a silicon layer having a thickness of about 6 μm laminated on a silicon layer with a thickness of about 400 μm, the same SOI wafer as that of Embodiment 1. The acceleration sensor elements of the respective ranges were formed simultaneously by photolithography, film deposition, and etching, and their weight, beams and support frame have the same thicknesses, respectively. The weight and the support frame are of the same thickness.

Embodiment 7

Figure 11A:
FIGS. 11A to 11H are plan views of the stress damping sections in other shapes as Embodiment 6.
Figure 11B:
Figure 11C:
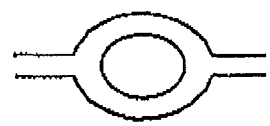
Figure 11D:
Figure 11E:
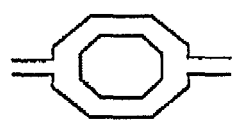
Figure 11F:
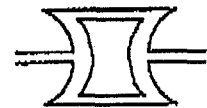
Figure 11G:
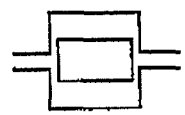
Figure 11H:
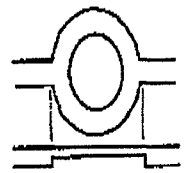

Other embodiments of the stress damping section will be described with reference to FIGS. 11A to 11H. FIG. 11A shows a stress damping section in a zigzag configuration which is constructed by consecutively connecting two of the stress damping sections each composed of zigzag connected sides as explained in Embodiment 2. FIG. 11B shows a zigzag structure formed by curved portions. FIG. 11C shows a round framed structure. FIG. 11D shows an elliptically framed structure. FIG. 11E shows an octagonally framed structure. FIG. 11F shows a structure having an hourglass-shaped frame. FIG. 11G has a square framed structure in which frame sides parallel in the direction of the beam extending are wide and frame sides orthogonal thereto are narrow. FIG. 11H shows in a plan view and a side view a structure in which the thickness of the stress damping section is smaller than the thickness of the beam. It is possible to use stress damping sections of shapes which are different between a beam formed in the X-axis direction and a beam formed in the Y-axis direction. Alternatively, it is possible to provide a plurality of stress damping sections of different shapes on the same beam.

Embodiment 8

Figure 12:
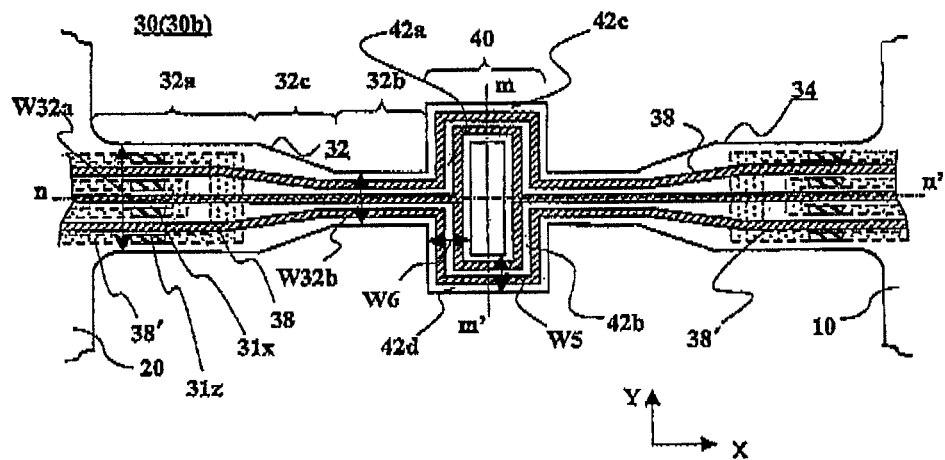
FIG. 12 is a plan view showing the arrangement of piezoresistance elements, metal wirings and P-type wirings on the beam provided with a framed stress damping section described in Embodiment 7.

An acceleration sensor element of Embodiment 8 having a beam structure with the stress damping effect of a framed stress damping section rendered higher will be described based on the plan view of FIG. 12. A framed stress damping section 40 is provided in nearly the center of a beam 30 (30b) between a support frame 10 and a weight 30. The beam 30b comprises a first portion 32, the framed stress damping section 40, and a second portion 34. The first portion 32 and the second portion 34 of the beam are each composed of a first root portion 32a connected to the weight 20 or the support frame 10, a second root portion 32b connected to the stress damping section 40, and a varying width portion 32c connecting the first root portion 32a and the second root portion 32b. Since the first root portion 32a is 50 μm long, the second root portion 32b is 60 μm long, the varying width portion 32c is 30 μm long, and the stress damping section 40 is 30 μm long, the length of the beam 30b between the support frame 10 and the weight 20 is 310 μm. In connection with the dimensions of the beam 30b, the width W32a of the first root portion 32a is 30 μm, and the width W32b of the second root portion 32b is 20 μm. The varying width portion 32c connecting the first root portion 32a and the second root portion 32b varies gradually in width from the first root portion 32a until the second root portion 32b. The width W6 of first and second frame sides 42a and 42b extending in the width direction (Y direction) of the beam of the stress damping section 40 was 12 μm, and the width W5 of third and fourth frame sides 42c and 42d extending in the direction of extension of the entire beam (i.e., X direction) was 12 μm. In FIG. 12, the beam 30b provided with piezoresistance elements 31x and 31z for detecting accelerations in the X-axis and the Z-axis is shown, and the layout of the piezoresistance elements 31x, 31z, metal wirings 38, and P type wirings 38' is also shown. Two of the X-axis piezoresistance elements 31x were arranged symmetrically with respect to the width center line n-n' of the beam 30b. The ends of the two X-axis piezoresistance elements 31x facing the stress damping section 40 were connected in series by the P type wiring 38', and the other ends thereof were led out of the beam 30b by the P type wirings 38' and connected to the metal wirings 38 (not shown). The Z-axis piezoresistance elements 31z were arranged outside the X-axis piezoresistance elements 31x, and the two Z-axis piezoresistance elements 31z were connected by the metal wirings 38 and the P type wirings 38' as were the X-axis piezoresistance elements 31x. Three of the metal wirings 38 passed from the side of the weight 20 over the beam 30b toward the support frame 10. One of the three metal wirings is disposed on the width center line n-n' of the beam 30b, and the other two metal wirings are disposed symmetrically with respect to the width center line n-n' of the beam 30b. A 0.2 μm thick silicon oxide film was formed on the surface of the beam, where the piezoresistance elements 31x, 31z and the P type wirings 38' were formed, for use as an electrical insulating film (not shown). The metal wirings 38 were formed on the insulating film.

The smaller the width W32a of the first root portion 32a where the piezoresistance elements are formed, the greater the weight displacement per unit acceleration becomes, the higher stress is caused to the piezoresistance element, and the higher sensitivity can be obtained. Thus, it is preferred that the width W32a be smaller. The length and width of the piezoresistance element are determined according to the resistance value of the piezoresistance element, and the distance between the piezoresistance elements is determined by the ensurance of insulation between the adjacent P type wirings. In view of these facts, therefore, the width W32a of the first root portion 32a was set at 30 μm in the present embodiment. In the stress damping section 40, the smaller the width W6 of the first and second frame sides 42a, 42b extending in the width direction of the beam (Y direction) and the larger the length of the first and second frame sides 42a, 42b present between the third and fourth frame sides 42c, 42d extending from the sides of the beam 30b in the direction in which the beam extends (X direction), the more easily the stress damping section is deformed by force exerted in the direction in which the beam extends, and the higher the stress damping effect can be rendered. The metal wiring located in the middle among the three metal wirings was bifurcated at the stress damping section, whereby the two wirings were present on each frame side. If the middle metal wiring is not bifurcated to have two wirings on one frame side and one wiring on the other frame side, there will occur a difference in flexural stress of the beam due to the difference in the number of the metal wirings located on the frame sides. This is not preferred. By bifurcating the middle metal wiring, the width of the frame side of the stress damping section was successfully rendered smaller than the width of the beam on which three wirings passed. Thus, the stress damping effect could be enhanced.

Moreover, the second root portion 32b without the piezoresistance element or the P type wiring was narrower than the first root portion 32a. Thus, the length of the first and second frame sides 42a, 42b extending in the width direction (Y direction) of the beam, which act to damp disturbance force, could be increased, while maintaining the entire length of the frame sides of the stress damping section extending in the width direction (Y direction) of the beam, namely, the width of the stress damping section. Hence, the stress damping effect could be enhanced. It is necessary to ensure such a distance between the weight and the stress damping section that the stress damping section does not contact the weight even when the beam and the stress damping section provided on the beam are deformed upon, exertion of great acceleration. If the width of the notch formed in the part of the weight connected to the beam is increased in order to render this distance large, the volume of the weight decreases, thus leading to a decrease in sensitivity. By forming the second root portion with a small width in the beam, it became possible to enhance the stress damping effect, without inducing a decrease in sensitivity.

Embodiment 9

Figure 13:
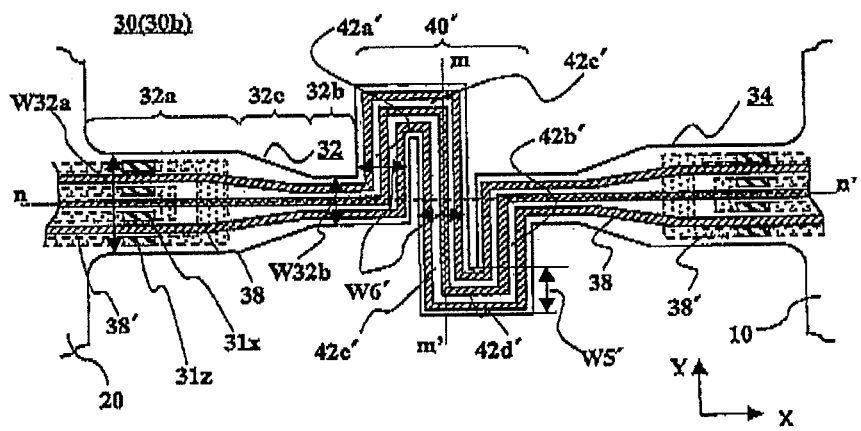
FIG. 13 is a plan view showing the arrangement of piezoresistance elements, metal wirings and P-type wirings on the beam provided with a stress damping section described in Embodiment 8, the stress damping section comprising sides connected zigzag.

An acceleration sensor element of Embodiment 9 having a beam structure with the stress damping effect of a stress damping section rendered higher, the stress damping section comprising zigzag connected sides, will be described based on the plan view of FIG. 13. A stress damping section 40' in a zigzag configuration is provided in nearly the center of a beam 30 (30b) between a support frame 10 and a weight 20. The beam 30b comprises a first portion 32, the zigzag-shaped stress damping section 40', and a second portion 34. The first portion 32 and the second portion 34 of the beam are each composed of a first root portion 32a connected to the support frame 10 or the weight 20, a second root portion 32b connected to the stress damping section 40', and a varying width portion 32c connecting the first root portion 32a and the second root portion 32b and gradually varying in width from the first root portion 32a until the second root portion 32b. Since the first root portion 32a was 50 μm long, the second root portion 32b was 40 μm long, the varying width portion 32c was 30 μm long, and the stress damping section 40' was 70 μm long, the length of the beam 30b between the support frame 10 and the weight 20 was 310 μm. In connection with the dimensions in the width direction of the beam 30b, the width W32a of the first root portion 32a is 30 μm, and the width W32b of the second root portion 32b is 20 μm. The width W6' of first and second sides 42a' and 42b' extending in the width direction (Y direction) of the beam of the stress damping section 40' was 20 μm, and the width W5' of third and fourth sides 42c' and 42d' extending in the direction of extension of the entire beam (i.e., X direction) was 20 μm. Piezoresistance elements 31x, 31z, metal wirings 38, and P type wirings 38' of the first root portion 32a were the same as those explained in Embodiment 8. Unlike the framed stress damping section shown in FIG. 12 for Embodiment 8, the zigzag-shaped stress damping section 40' shown in FIG. 13 has no bifurcation, so that the three metal wirings 38 are formed on the stress damping section 40'. Thus, the width W6' of the first and second sides 42a' and 42b' extending in the width direction (Y direction) of the beam of the stress damping section 40', and the width W5' of the third and fourth sides 420' and 42d' extending in the direction of extension of the entire beam (i.e., X direction) were the same as the width W32b of the second root portion 32b, and they were each 20 p.m. In the stress damping section of the zigzag shape, the smaller the width W6' of the first and second sides 42a', 42b' extending in the width direction of the beam (Y direction) of the stress damping section 40', and the larger the length of a fifth side 42e' extending in the width direction of the beam (Y direction) between the third and fourth sides 42c' and 42d' of the stress damping section extending in the direction in which the entire beam extends (X direction), the more easily the stress damping section is deformed by stress imposed in the direction in which the entire beam extends, and the higher the stress damping effect can be rendered. Since the side width W6' of the stress damping section was rendered smaller than the width W32a of the first root portion 32a, the stress damping section could be enhanced. Moreover, the width W32b of the second root portion 32b was rendered smaller than the width W32a of the first root portion 32a. Thus, the length of the fifth side 42e' extending in the width direction (Y direction) of the beam between the third and fourth 42c' and 42d' of the stress damping section extending in the direction of extension of the entire beam (X direction) could be increased, while maintaining the entire width of the stress damping section. Hence, the stress damping effect could be enhanced. It is necessary to ensure such a distance that the stress damping section does not contact the weight even when the beam and the stress damping section provided on the beam are deformed upon exertion of great acceleration. If the width of the notch formed in the part of the weight connected to the beam is increased in order to render this distance large, the volume of the weight decreases, thus leading to a decrease in sensitivity. By forming the constricted portion with a small width in the beam, it became possible to enhance the stress damping effect, without inducing a decrease in sensitivity.

Embodiment 10

Figure 14:
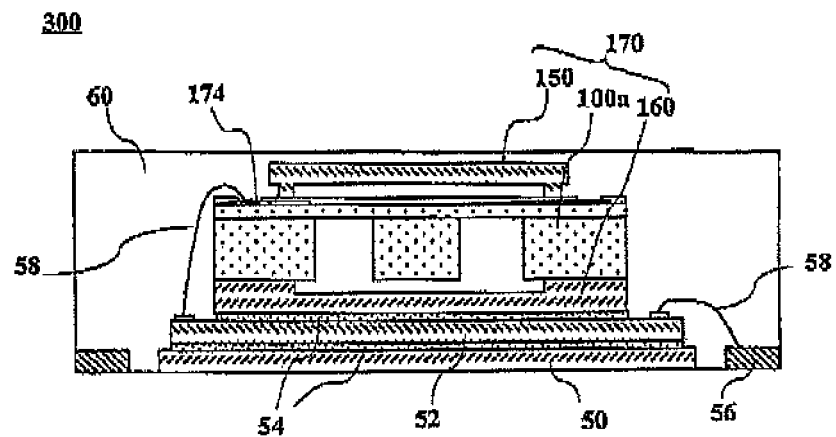
FIG. 14 shows, in a sectional view, a resin-molded acceleration sensor described in Embodiment 9.

An embodiment of a resin-molded acceleration sensor 300 will be described based on a sectional view of FIG. 14. A detecting IC 52 for performing the amplification of a signal from an acceleration sensor element, temperature compensation, etc. is fixed onto a 200 μm thick lead frame 50 with the use of an adhesive 54. The acceleration sensor element 100a having the framed stress damping sections provided in the four beams, which has been described in Embodiment 1, is used. An MEMS assembly 170, which has an upper cap chip 150 joined onto the acceleration sensor element 100a and a lower cap chip 160 joined to the underside of the acceleration sensor element 100a, is fixed onto the detecting IC 52 by the adhesive 54. Bare gold wires 58 with a diameter of 25 μm connect electrode pads 174 of the MEMS assembly 170 to the detecting IC 52, and connect the detecting IC 52 to a frame terminal 56, with the use of an ultrasonic bonder. A structure having the MEMS assembly 170 and the detecting IC 52 assembled on the lead frame 50 is shaped with an epoxy resin 60 using the transfer mold method. Within the MEMS assembly 170, the weight and the beams of the acceleration sensor element 100a are held in a space surrounded by a support frame, the upper cap chip 150, and the lower cap chip 160. The surroundings of the MEMS assembly 170 are molded with the epoxy resin 60. Thus, the acceleration sensor element 100a can work within the space kept hermetic.

Embodiment 11

Figure 15:
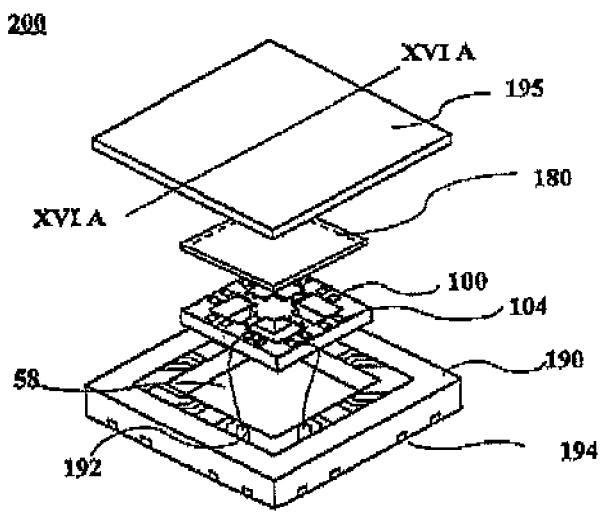
FIG. 15 is an exploded perspective view of a triaxial acceleration sensor.
Figure 16A:
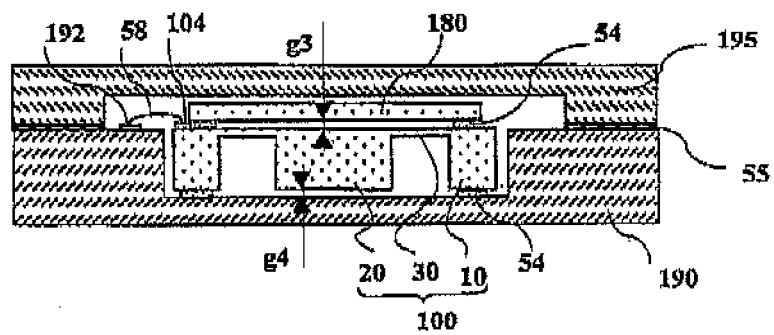
FIG. 16A is a sectional view taken on line XVI A-XVI A in FIG. 15.
Figure 16B:
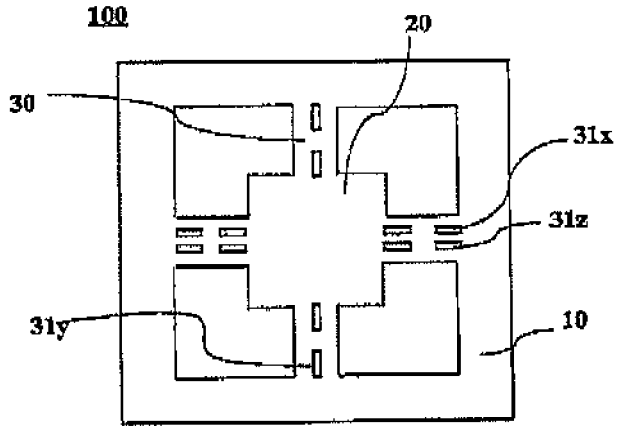
FIG. 16B is a plan view of an acceleration sensor element used in FIG. 15.
Figure 17:
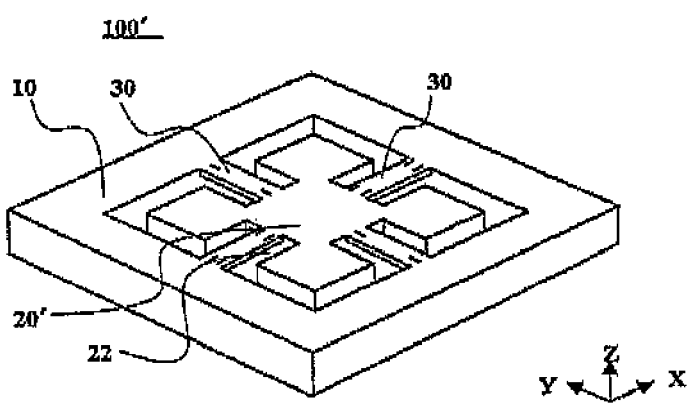
FIG. 17 is a perspective view showing the structure of an acceleration sensor element of a conventional triaxial acceleration sensor.
Figure 18:
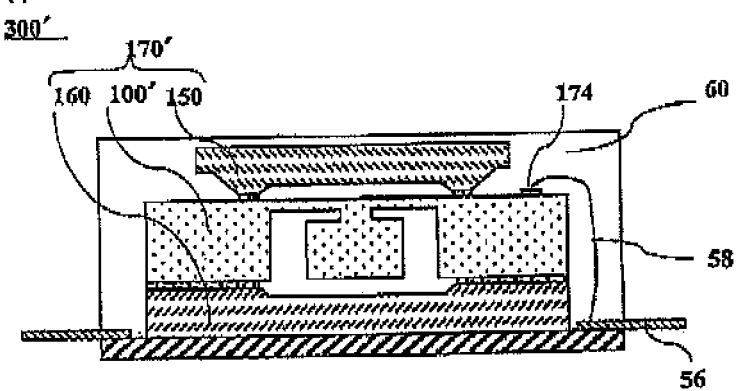
FIG. 18 is a sectional view showing the resin package assembly structure of the conventional triaxial acceleration sensor.

Using the acceleration sensor element having the framed stress damping section of Embodiment 1 and the acceleration sensor element having the zigzag-shaped stress damping section of Embodiment 2, their disturbance forces and changes in the sensitivity in the z-axis were measured. As the acceleration sensor elements, there were prepared an acceleration sensor 200 (called case type) using a package as shown in FIG. 15, and an acceleration sensor 300 (called WLP type) subjected to wafer level packaging, followed by separation into discrete pieces and resin molding, as shown in FIG. 14. For comparison, a conventional acceleration sensor element without a stress damping section (called a conventional product) was also provided as a sample. Three hundred to 500 of the acceleration sensors of the respective types were prepared, and measured for the sensitivity in the Z-axis, whereafter their mean values were calculated. The disturbance forces include stress by the adhesive for adhering the acceleration sensor element to the case or the regulating plate, and the heat of wire welding, in the case of the case type. With the WLP type, the disturbance forces include the pressing force of the cap chip during wafer level packaging, stress from the joining material, thermal stress by a temperature change, and the stress of the molding material during resin molding. The adhesive used for the case type exerts low disturbance force, because its coefficient of elasticity is low. On the other hand, the WLP type exerts high force in joining or the like, and the influence of disturbance force is great. With the conventional product, the Z-axis sensitivity in the WLP type increased 34 compared with the case type. With the acceleration sensors having the framed and the zigzag stress damping section formed therein, on the other hand, an increase in the Z-axis sensitivity could be kept down to 3%. The formation of the stress damping section was successfully confirmed to be particularly effective in curtailing the amount of change in the sensitivity of the WLP type acceleration sensor.

The invention claimed is:

1. An acceleration sensor comprising an acceleration sensor element including
   a support frame,
   a weight movable relative to the support frame when acceleration is applied from an outside,
   a plurality of flexible beams for connecting the weight and the support frame to support the weight,
   semiconductor piezoresistance elements provided on the beams near sites where the beams are connected to the weight or the support frame, and
   wirings connected to the semiconductor piezoresistance elements and provided on the beams,
   the acceleration sensor element being adapted to detect the acceleration applied from the outside in response to changes in resistance of the semiconductor piezoresistance elements,
   wherein of the plurality of beams, the beams provided with the semiconductor piezoresistance elements for detecting acceleration in a thickness direction of the beams each have at least one stress damping section,
   wherein the stress damping section is provided on a portion of the beam which is outside regions of the beam where the semiconductor piezoresistance elements are provided, and
   the beams is symmetrical with respect to a point of intersection between a length center line of the beam and a width center line of the beam.

2. The acceleration sensor according to claim 1, wherein the beam provided with the stress damping section has a first portion connecting the weight and the stress damping section, and a second portion connecting the support frame and the stress damping section,
   the first portion and the second portion extend in a direction in which the entire beam extends, and have a substantially identical thickness, and
   the first portion and the second portion of the beam bend in an identical direction under stress applied to the beam from the outside in the direction in which the entire beam extends.

3. The acceleration sensor according to claim 1, wherein the beam provided with the stress damping section has a first portion connecting the weight and the stress damping section, and a second portion connecting the support frame and the stress damping section,
   the first portion and the second portion extend in a direction in which the entire beam extends, and have a substantially identical thickness, and
   the stress damping section is a frame which is located between the first portion and the second portion, which is connected to an end of the first portion opposite to an end of the first portion connected to the weight and is connected to an end of the second portion opposite to an end of the second portion connected to the support frame, and which has an opening in a center thereof.

4. The acceleration sensor according to claim 3, wherein the wirings provided in the frame having the opening in the center thereof are symmetrical with respect to the width center line of the beam provided with the stress damping section.

5. The acceleration sensor according to claim 3, wherein the stress damping section is a quadrilateral frame comprising
   a first frame side which is connected to an end of the first portion of the beam where the stress damping section is provided, the end being opposite to an end of the first portion connected to the weight, and which extends in a width direction of the beam,
   a second frame side which is connected to an end of the second portion opposite to an end of the second portion connected to the support frame, and which extends in the width direction of the beam, and
   a third frame side and a fourth frame side which interconnect ends of the first frame side and the second frame side and which extend in the direction in which the entire beam extends.

6. The acceleration sensor according to claim 1, wherein of the plurality of beams, the beams provided with the semiconductor piezoresistance elements for detecting the acceleration in the thickness direction of the beams each have a plurality of the stress damping sections,
   the beam provided with the plurality of stress damping sections has a first portion connecting the weight and one of the stress damping sections, a second portion connecting the support frame and another of the stress damping sections, and at least one third portion connecting adjacent two of the plurality of stress damping sections,
   the first, second and third portions extend in a direction in which the entire beam extends, and have a substantially identical thickness, and
   the plurality of stress damping sections are each a frame which is provided between the first portion or the second portion and one of the third portions, or between two of the third portions, which is connected to an end of one of the third portions, and to an end of the first portion or the second portion opposite to an end of the first portion or the second portion connected to the weight or the support frame, or to an end of the other third portion, and which has an opening in a center thereof.

7. The acceleration sensor according to claim 6, wherein the plurality of stress damping sections are each a quadrilateral frame comprising
   a first frame side which is connected to an end of the first portion of the beam where the plurality of stress damping sections are provided, the end being opposite to an end of the first portion connected to the weight, or is connected to an end of one of the third portions of the beam, and which extends in a width direction of the beam,
   a second frame side which is connected to an end of the one of the third portions, or to an end of the second portion opposite to an end of the second portion connected to the support frame, and which extends in the width direction of the beam, and
   a third frame side and a fourth frame side which interconnect ends of the first frame side and the second frame side and which extend in the direction in which the entire beam extends.

8. The acceleration sensor according to claim 1, wherein the beam provided with the stress damping section has a first portion connecting the weight and the stress damping section, and a second portion connecting the support frame and the stress damping section, the first portion and the second portion extend in a direction in which the entire beam extends, and have a substantially identical thickness, and the stress damping section is composed of sides which are located between the first portion and the second portion, which continue from an end of the first portion opposite to an end of the first portion connected to the weight and continue to an end of the second portion opposite to an end of the second portion connected to the support frame, and which are connected zigzag.

9. The acceleration sensor according to claim 8, wherein the sides connected zigzag comprise a first side which is connected to an end of the first portion of the beam where the stress damping section is provided, the end being opposite to an end of the first portion connected to the weight, and which extends in a width direction of the beam, a second side which is connected to an end of the second portion opposite to an end of the second portion connected to the support frame, and which extends in the width direction of the beam and in a direction opposite to the first side, a third side extending from an outer end of the first side in the direction in which the entire beam extends, a fourth side extending from an outer end of the second side in the direction in which the entire beam extends, and a fifth side which is located on a line drawn in the width direction of the beam at a midpoint between a point where the first side is connected to the first portion and a point where the second side is connected to the second portion, and which interconnects ends of the third side and the fourth side.

10. The acceleration sensor according to claim 1, wherein of the plurality of beams, the beams provided with the semiconductor piezoresistance elements for detecting the acceleration in the thickness direction of the beams each have a plurality of the stress damping sections, the beam provided with the plurality of stress damping sections has a first portion connecting the weight and one of the stress damping sections, a second portion connecting the support frame and another of the stress damping sections, and at least one third portion connecting adjacent two of the plurality of stress damping sections, the first, second and third portions extend in a direction in which the entire beam extends, and have an identical thickness, and the plurality of stress damping sections are each composed of sides which are provided between the first portion or the second portion and one of the third portions, or between two of the third portions, which continue from an end of one of the third portions to an end of the first portion or the second portion opposite to an end of the first portion or the second portion connected to the weight or the support frame, or to an end of the other third portion, and which are connected zigzag.

11. The acceleration sensor according to claim 10, wherein the sides connected zigzag comprise a first side which is connected to an end of the first portion of the beam where the plurality of stress damping sections are provided, the end being opposite to an end of the first portion connected to the weight, or is connected to an end of one of the third portions of the beam, and which extends in a width direction of the beam, a second side which is connected to an end of the one of the third portions, or to an end of the second portion opposite to an end of the second portion connected to the support frame, and which extends in the width direction of the beam and in a direction opposite to the first side, a third side extending from an outer end of the first side in the direction in which the entire beam extends, a fourth side extending from an outer end of the second side in the direction in which the entire beam extends, and a fifth side which is located on a line drawn in the width direction of the beam at a midpoint between a point where the first side is connected to the first portion or the third portion and a point where the second side is connected to the third portion or the second portion, and which interconnects ends of the third side and the fourth side.

\* \* \* \* \*